(12) United States Patent
Arai

(10) Patent No.: US 8,686,548 B2
(45) Date of Patent: Apr. 1, 2014

(54) WIRING SUBSTRATE, METHOD FOR MANUFACTURING WIRING SUBSTRATE, AND SEMICONDUCTOR PACKAGE INCLUDING WIRING SUBSTRATE

(75) Inventor: Tadashi Arai, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 262 days.

(21) Appl. No.: 12/987,398

(22) Filed: Jan. 10, 2011

(65) Prior Publication Data

US 2011/0169133 A1 Jul. 14, 2011

(30) Foreign Application Priority Data

Jan. 12, 2010 (JP) ................. 2010-004394

(51) Int. Cl.
*H01L 23/02* (2006.01)

(52) U.S. Cl.
USPC ............ 257/678; 257/734; 257/532; 438/125

(58) Field of Classification Search
CPC .......... H01L 2224/32225; H01L 2924/09701; H01L 2224/16225
USPC ......... 257/532, 668, 692, 774, 508, 678, 734; 438/125
See application file for complete search history.

(56) References Cited

U.S. PATENT DOCUMENTS

| 7,215,010 | B2 * | 5/2007 | Bast et al. ...................... 257/668 |
| 7,550,321 | B2 * | 6/2009 | Palanduz ...................... 438/125 |
| 8,455,766 | B2 * | 6/2013 | Tanaka et al. ................. 174/255 |
| 2002/0074615 | A1 * | 6/2002 | Honda ........................... 257/508 |
| 2008/0284037 | A1 * | 11/2008 | Andry et al. .................... 257/774 |
| 2010/0276796 | A1 * | 11/2010 | Andry et al. .................... 257/692 |

FOREIGN PATENT DOCUMENTS

| JP | 2002-299486 | 10/2002 |
| JP | 2003-503855 | 1/2003 |
| JP | 2004-056145 | 2/2004 |
| JP | 2006-012687 | 1/2006 |
| JP | 2007-123371 | 5/2007 |
| JP | 2007-266182 | 10/2007 |
| JP | 2008-160019 | 7/2008 |
| WO | WO01/01486 | 1/2001 |

OTHER PUBLICATIONS

Office Action dated Dec. 10, 2013 Issued with respect to the corresponding Japanese Patent Application No. 2010-004394.

* cited by examiner

*Primary Examiner* — Eugene Lee
*Assistant Examiner* — Fang-Xing Jiang
(74) *Attorney, Agent, or Firm* — IPUSA, PLLC

(57) ABSTRACT

A wiring substrate includes a ceramic substrate including plural ceramic layers, an inner wiring, and an electrode electrically connected to the inner wiring, the electrode exposed on a first surface of the ceramic substrate, and a silicon substrate body having a front surface and a back surface situated on an opposite side of the front surface and including a wiring pattern formed on the front surface and a via filling material having one end electrically connected to the wiring pattern and another end exposed at the back surface. The back surface is bonded to the first surface of the ceramic substrate via a polymer layer. The via filling material penetrates through the polymer layer and is directly bonded to the electrode.

6 Claims, 31 Drawing Sheets

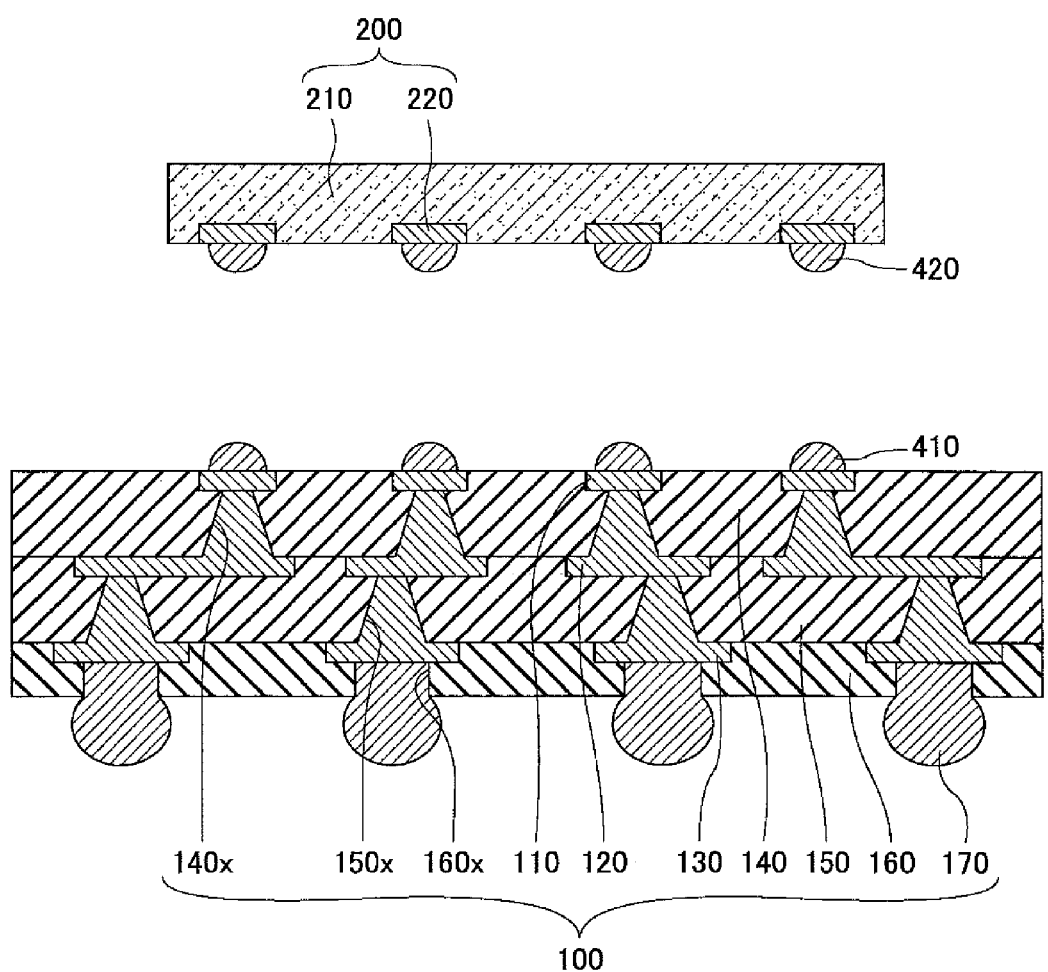

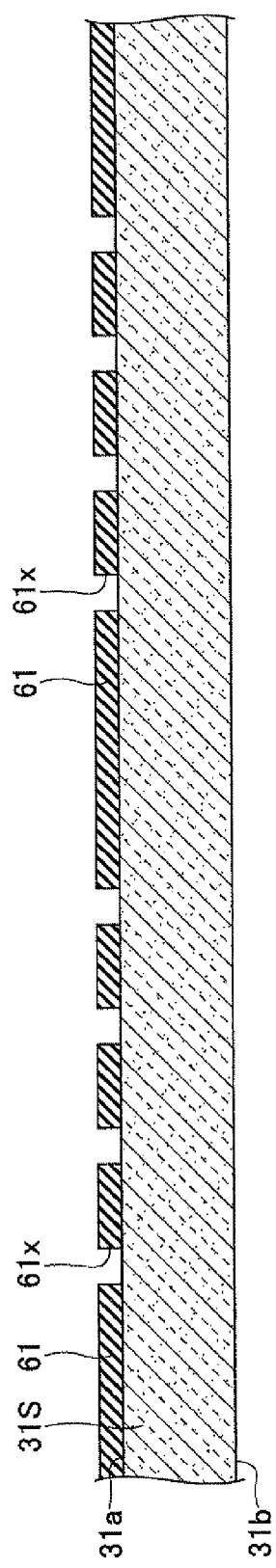
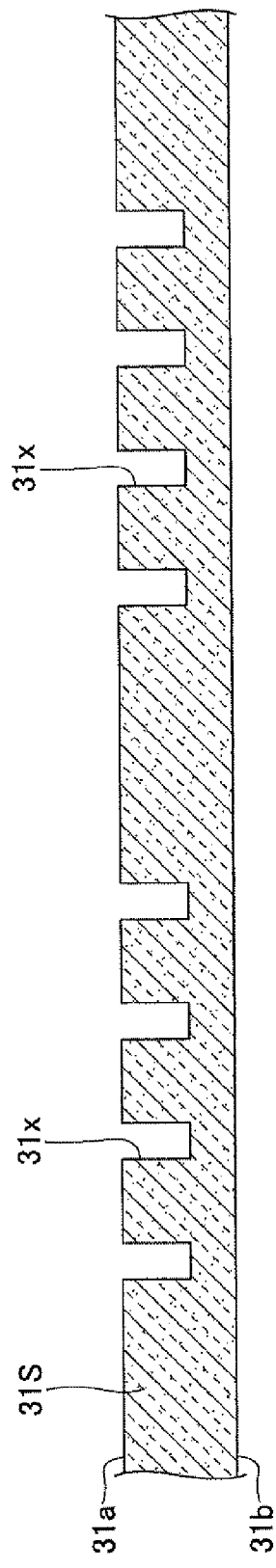

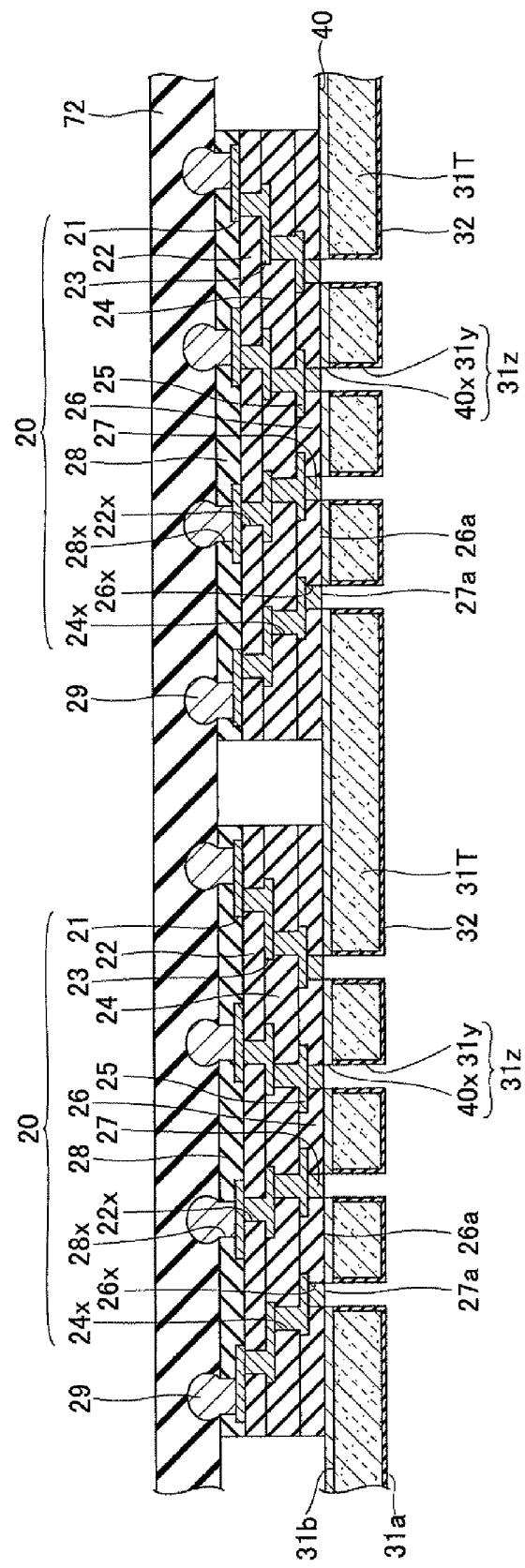

US 8,686,548 B2

WIRING SUBSTRATE, METHOD FOR MANUFACTURING WIRING SUBSTRATE, AND SEMICONDUCTOR PACKAGE INCLUDING WIRING SUBSTRATE

CROSS-REFERENCE TO RELATED APPLICATIONS

This application is based upon and claims the benefit of priority of the prior Japanese Priority Application No. 2010-004394 filed on Jan. 12, 2010, the entire contents of which are incorporated herein by reference.

BACKGROUND OF THE INVENTION

1. Field of the Invention

The present invention generally relates to a wiring substrate, a method for manufacturing the wiring substrate, and a semiconductor package including the wiring substrate.

2. Description of the Related Art

There is known a semiconductor package having a semiconductor chip mounted on a wiring substrate via solder bumps or the like. In this semiconductor package, the wiring substrate acts as an interposer during a process of connecting the semiconductor chip to a target substrate (e.g., motherboard). A related art example of a semiconductor package 500 having a wiring substrate 100 acting as an interposer is described with reference to FIG. 1.

FIG. 1 is a cross-sectional view of the semiconductor package 500 according to the related art example. With reference to FIG. 1, the semiconductor package 500 has a semiconductor chip 200 mounted on a substantially center portion of the wiring substrate 100 via plural semiconductor bumps 300. The semiconductor chip 200 is sealed to the wiring substrate 100 with an underfill resin.

The wiring substrate 100 has a layered structure in which a solder resist layer 160, a third wiring layer 130, a second insulating layer 150, a second wiring layer 120, a first insulating layer 140, and a first wiring layer 110 are layered in this order. The first wiring layer 110 and the second wiring layer 120 are electrically connected via first via holes 140x provided inside the first insulating layer 140. The second wiring layer 120 and the third wiring layer 130 are electrically connected via second via holes 150x provided inside the second insulating layer 150.

An outer connection terminal (e.g., solder ball) 170 is formed on the third wiring layer 13 being exposed at a corresponding opening part 160x of the solder resist layer 160. The first wiring layer 110 functions as an electrode pad to be connected to a corresponding electrode pad 220 of the semiconductor chip 200. The outer connection terminal 170 functions as a terminal to be connected to a target substrate (e.g., motherboard). The wiring substrate 100 is typically formed of plural layers due to constraints such as wiring width or via hole diameter.

The semiconductor chip 200 includes a semiconductor substrate 210 and the electrode pad 220 formed on the semiconductor substrate 210. The semiconductor substrate 210 is formed of a substrate (e.g., silicon substrate) having a semiconductor integrated circuit (not illustrated) formed thereon. The electrode pad 220, which is formed on one side of the semiconductor substrate 210, is electrically connected to the semiconductor integrated circuit (not illustrated).

The first wiring layer 110 of the wiring substrate 100 is electrically connected to a corresponding electrode pad 220 of the semiconductor chip 200 via a corresponding solder bump 300. The underfill resin 400 is filled at an interface space between the semiconductor chip 200 and the wiring substrate 100.

Next, a method of manufacturing a semiconductor package according to a related art example is described. In FIGS. 2, 3A and 3B, like components are denoted by like reference numerals as of those of FIG. 1 and are not further explained.

The wiring substrate 100 and the semiconductor chip 200, which are manufactured by known methods, are prepared as illustrated in FIG. 2. Plural pre-solder bumps 410 are formed on the first wiring layer 110 of the wiring substrate 100. Plural pre-solder bumps 420 are formed on corresponding electrode pads 220 of the semiconductor chip 200.

Then, as illustrated in FIG. 3A, the first wiring layer 110 side of the wiring substrate 100 and the electrode pad 220 side of the semiconductor chip 200 are faced against each other in a manner that the positions of the pre-solder bumps 410 match the positions of the pre-solder bumps 420. Then, as illustrated in FIG. 3B, the solder bumps 300 are formed by melting the pre-solder bumps 410, 420 with a heating temperature of, for example, 230° C.

Further, in FIG. 3B, by filling the interface space between the semiconductor chip 200 and the wiring substrate 100, the manufacturing of the semiconductor package 500 mounted with the semiconductor chip 200 (the same as the semiconductor chip illustrated in FIG. 1) is completed. The wiring substrate 100 is to be formed having a thickness to some degree for preventing the wiring substrate 100 from being bent by cure shrinkage of the underfill resin 400.

The semiconductor package 500 is to be connected to a target substrate (e.g., motherboard) via the outer connection terminals 170. Thereby, with the above-described semiconductor package 500, the wiring substrate 100 functions as an interposer for connecting the semiconductor chip 200 and the target substrate (e.g., motherboard).

In the evolution of downsizing, due to advances in the refining (fine size) of the semiconductor chip, the interposer used for mounting the semiconductor chip is also desired to have refined (fine-sized) wiring. However, it is becoming difficult to satisfy such desire with the wiring substrate illustrated in FIG. 1. Although consideration is being made for a Si (silicon) based multilayer interposer that satisfies the desire for forming fine-sized wiring, a large investment is to be made on the facility for manufacturing the multilayer interposer. This leads to an increase of manufacturing cost.

SUMMARY OF THE INVENTION

The present invention may provide a wiring substrate, a method for manufacturing the wiring substrate, and a semiconductor package including the wiring substrate that substantially eliminates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a wiring substrate, a method for manufacturing the wiring substrate, and a semiconductor package including the wiring substrate particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a wiring substrate including: a ceramic substrate including a plurality of ceramic layers, an inner wiring, and an electrode electrically connected to the inner wiring, the electrode exposed on a first surface of the ceramic substrate; and a silicon substrate body having a front surface and a back surface situated on an opposite side of the front surface and including a wiring pattern formed on the front surface and a via filling material having one end electrically connected to the wiring pattern and another end exposed at the back surface; wherein the back surface is bonded to the first surface of the ceramic substrate via a polymer layer, wherein the via filling material penetrates through the polymer layer and is directly bonded to the electrode.

Other objects and further features of the present invention will be apparent from the following detailed description when read in conjunction with the accompanying drawings.

BRIEF DESCRIPTION OF THE DRAWINGS

FIG. 2 is a schematic diagram for describing a semiconductor package manufacturing method according to a related art example;

FIG. 5 is a schematic diagram for describing steps of manufacturing the wiring substrate according to the first embodiment of the present invention (part 1);

FIG. 6 is a schematic diagram for describing steps of manufacturing the wiring substrate according to the first embodiment of the present invention (part 2);

FIG. 22 is a schematic diagram for describing steps of manufacturing the wiring substrate according to the second embodiment of the present invention (part 4);

DESCRIPTION OF THE PREFERRED EMBODIMENTS

In the following, embodiments of the present invention will be described with reference to the accompanying drawings.

First Embodiment

Configuration of Wiring Substrate

Figure 1:
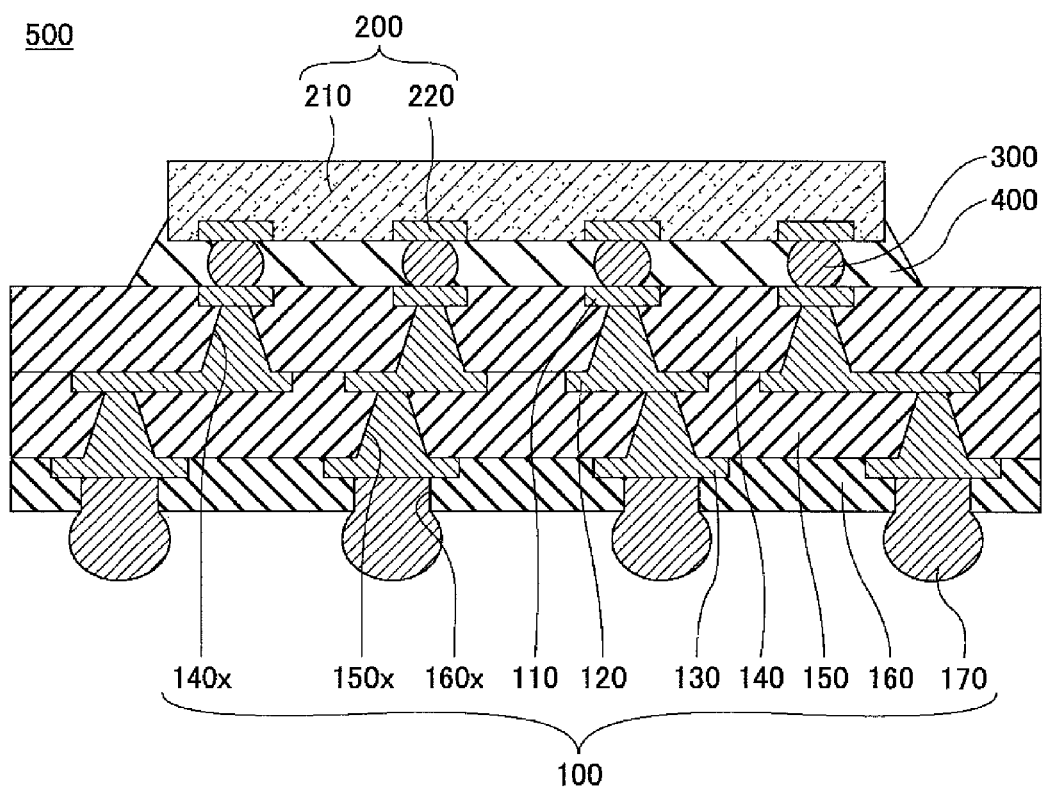
FIG. 1 is a cross-sectional view of a semiconductor package according to a related art example.
Figure 3A:
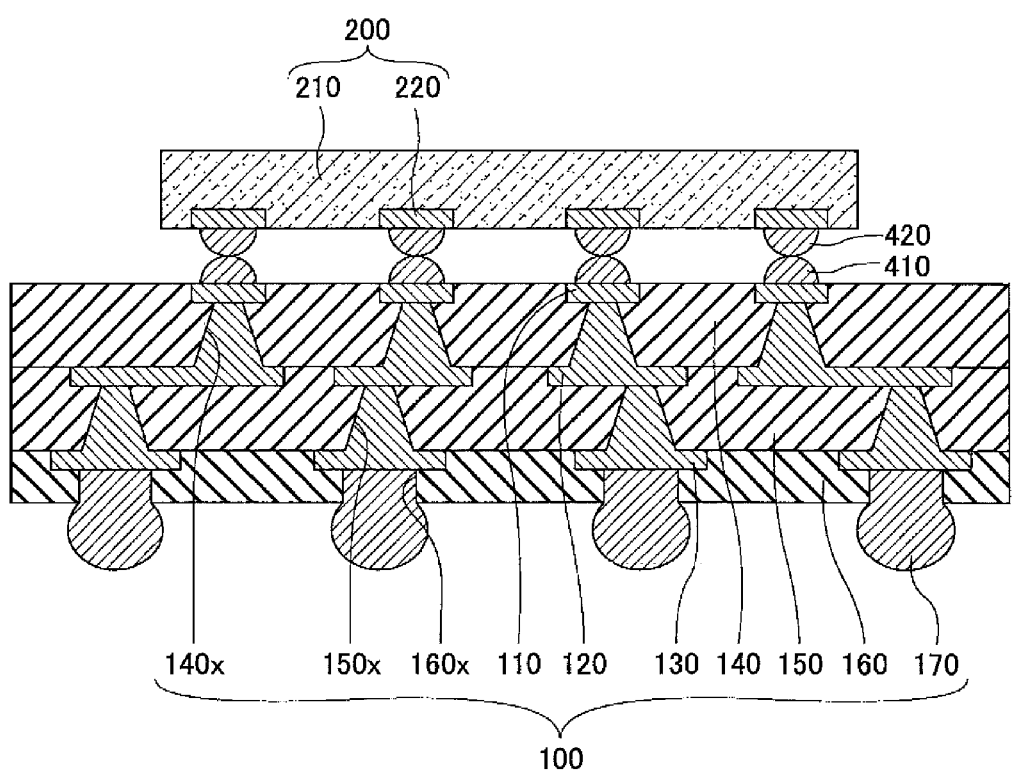
FIGS. 3A and 3B are schematic diagrams for describing a semiconductor package manufacturing method according to a related art example.
Figure 3B:
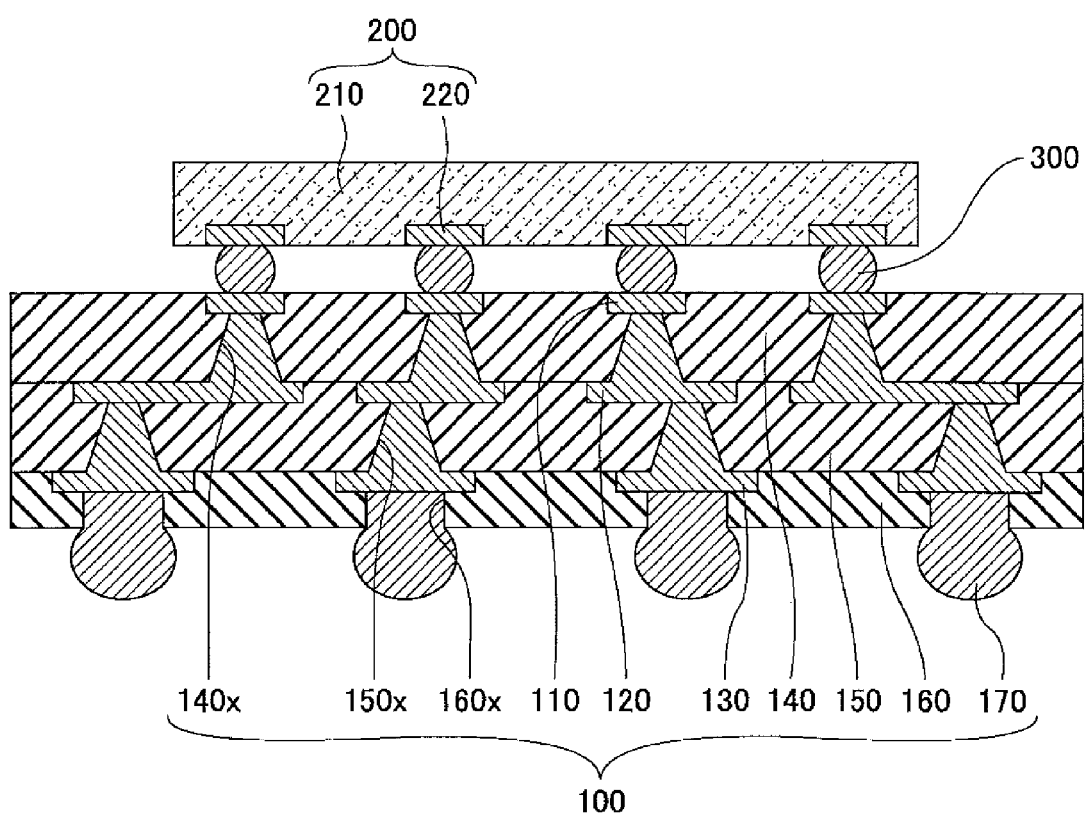
Figure 4:
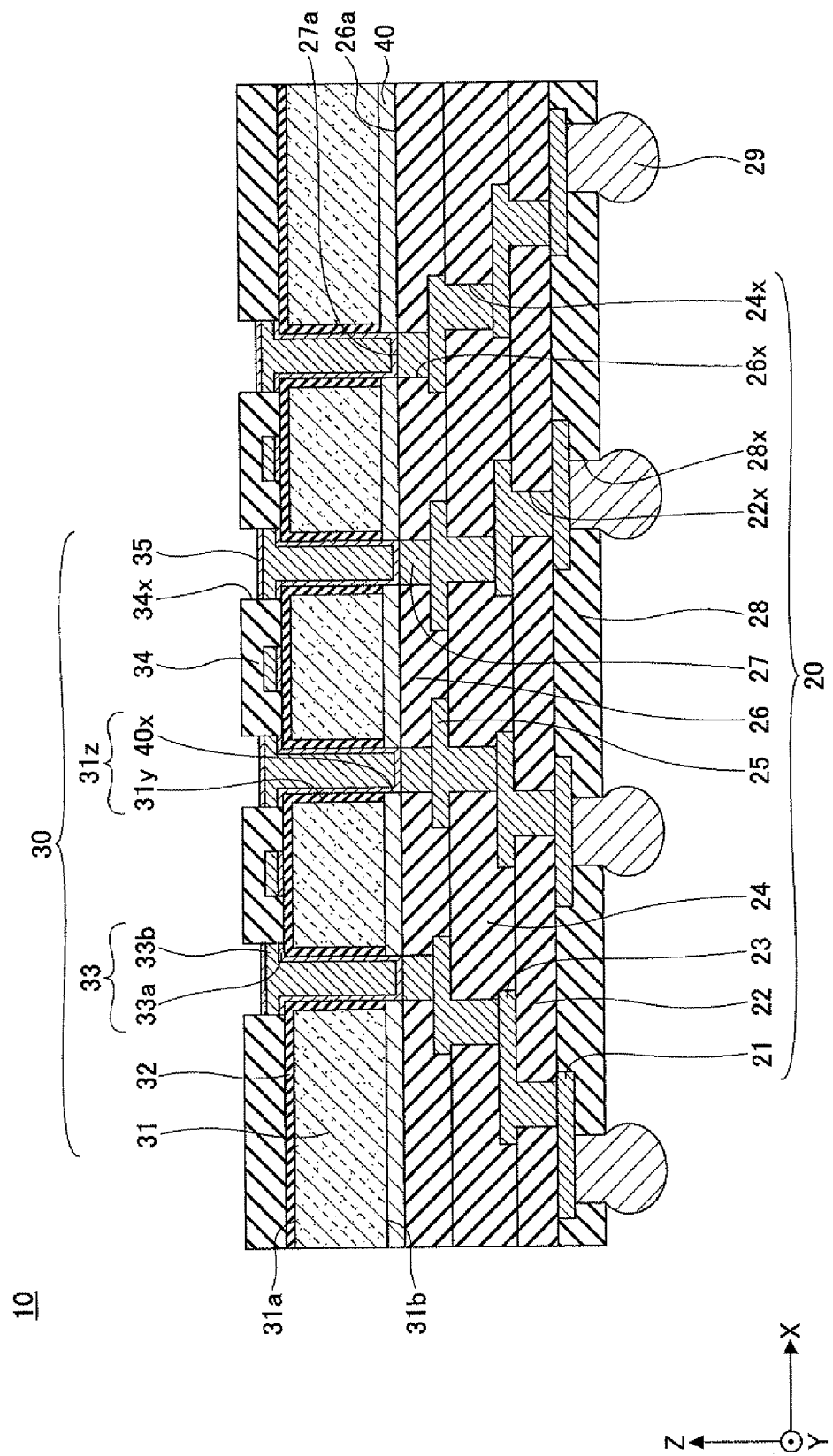
FIG. 4 is a cross-sectional view illustrating an example of a wiring substrate according to a first embodiment of the present invention.

An exemplary configuration of a wiring substrate 10 including a ceramic substrate 20 and a silicon substrate 30 is described. FIG. 4 is a cross-sectional view illustrating an example of the wiring substrate 10 according to the first embodiment of the present invention. With reference to FIG. 4, the wiring substrate 10 has the silicon substrate 30 bonded onto a ceramic substrate 20 via a polymer layer 40 (i.e. so-called polymer bonded structure). An outer connection terminal(s) 29 is provided in the ceramic substrate 20.

In this embodiment, the wiring substrate 10 has a rectangular shape. The wiring substrate 10 may be formed having a width of, for example, approximately 15 mm (X direction) and a depth of, for example, approximately 15 mm (Y direction). The ceramic substrate 20 may be formed having a thickness of, for example, approximately 50-1000 μm (Z direction). The silicon substrate 30 may be formed having a thickness of, for example, approximately 50-500 μm (Z direction). The polymer layer 40 may be formed having a thickness of, for example, approximately 5-20 μm (Z direction). The ceramic substrate 20, the outer connection terminal 29, the silicon substrate 30, and the polymer layer 40 are described in further detail below.

The ceramic substrate 20 includes a first wiring layer 21, a first ceramic layer 22, a second wiring layer 23, a second ceramic layer 24, a third wiring layer 25, a third ceramic layer 26, an electrode 27, and a solder resist layer 28. The first ceramic layer 22, the second ceramic layer 24, and the third ceramic layer 26 are used as insulating layers of the ceramic substrate 20. The ceramic substrate 20 is a low temperature co-fired ceramic (so-called LTCC) multilayer substrate. Alternatively, a high temperature co-fired ceramic (so-called HTCC) multilayer substrate may be used as the ceramic substrate 20.

The LTCC can be formed into a thin size more easily compared to the HTCC. Further, because the LTCC is fired at a low temperature of approximately 900° C., a material having a low melting point and a high conductivity (e.g., copper (Cu), silver (Ag), gold (Au)) may be used as the material of the electrode or the wiring layer of the ceramic substrate 20. Therefore, the ceramic substrate 20 can be formed having a low wiring resistance. The LTCC is more susceptible to acid or alkali compared to the HTCC and has a low rigidity compared to that of the HTCC.

On the other hand, it is more difficult to form the HTCC into a thin size compared to the LTCC. Further, because the LTCC is fired at a high temperature of approximately 1600° C., a material having a low melting point and a high conductivity (e.g., copper (Cu), silver (Ag), gold (Au)) cannot be used as the material of the electrode or the wiring layer of the ceramic substrate 20. Therefore, a material having a high melting point and a low conductivity (e.g., tungsten, molybdenum) is to be used as the material of the electrode or the wiring layer of the ceramic substrate 20. Thus, the ceramic substrate 20 cannot be formed having a low wiring resistance. The HTCC is more resistant to acid or alkali compared to the LTCC and has a high rigidity compared to that of the LTCC.

Accordingly, because the LTCC and the HTCC have different characteristics, the use of the LTCC or the HTCC may be determined depending on the usage (purpose) of the ceramic substrate 20.

In this embodiment, the LTCC is used for the below-described example of the ceramic substrate 20.

The first wiring layer 21 is formed on a first surface of the first ceramic layer 22. The material of the first wiring layer 21 may be, for example, copper (Cu). Alternatively, silver (Ag) or gold (Au) may be used as the material of the first wiring layer 21. The thickness of the first wiring layer 21 may be, for example, approximately 5 μm.

The material of the first ceramic layer 22 may be, for example, a glass containing sodium oxide ($Na_2O$), aluminum oxide ($Al_2O_3$), boron oxide ($B_2O_3$), or silicon dioxide ($SiO_2$) added with alumina-cordierite. The thickness of the first ceramic layer 22 is, for example, 10 μm.

Cordierite is a compound including magnesium oxide (MgO), aluminum oxide ($Al_2O_3$), and silicon dioxide ($SiO_2$). One example of a composition of the cordierite is $2MgO.2Al_2O_3.5SiO_2$. The alumina cordierite is formed by mixing cordierite with aluminum oxide ($Al_2O_3$).

The second wiring layer 23 is formed on a second surface of the first ceramic layer 22. The second wiring layer 23 is configured including a via filling material filling the inside of the first via hole 22x and a wiring pattern formed on the first ceramic layer 22. The first via hole 22x is formed penetrating through the first ceramic layer 22 and exposing an upper surface of the first wiring layer 21. The second wiring layer 23 is electrically connected to the first wiring layer 21 exposed in the first via hole 22x. The material of the second wiring layer 23 may be, for example, copper (Cu). Alternatively, silver (Ag) or gold (Au) may be used as the material of the second wiring layer 23. The thickness of the second wiring layer 23 may be, for example, approximately 5 μm.

The second ceramic layer 24 is formed on the first ceramic layer 22 in a manner covering the second wiring layer 23. The material of the second ceramic layer 24 may be, for example, a glass containing sodium oxide ($Na_2O$), aluminum oxide ($Al_2O_3$), boron oxide ($B_2O_3$), or silicon dioxide ($SiO_2$) added with alumina-cordierite. The thickness of the second ceramic layer 24 is, for example, 10 μm.

The third wiring layer 25 is formed on the second ceramic layer 24. The third wiring layer 25 is configured including a via filling material filling the inside of the second via hole 24x and a wiring pattern formed on the second ceramic layer 24. The second via hole 24x is formed penetrating through the second ceramic layer 24 and exposing an upper surface of the second wiring layer 23. The third wiring layer 25 is electrically connected to the second wiring layer 23 exposed in the second via hole 24x. The material of the third wiring layer 25 may be, for example, copper (Cu). Alternatively, silver (Ag) or gold (Au) may be used as the material of the third wiring layer 25. The thickness of the third wiring layer 25 may be, for example, approximately 5 μm.

The third ceramic layer 26 is formed on the second ceramic layer 24 in a manner covering the third wiring layer 25. The material of the third ceramic layer 26 may be, for example, a glass containing sodium oxide ($Na_2O$), aluminum oxide ($Al_7O_3$), boron oxide ($B_2O_3$), or silicon dioxide ($SiO_2$) added with alumina-cordierite. The thickness of the third ceramic layer 26 is, for example, 10 μm.

The coefficient of thermal expansion (CTE) of the first ceramic layer 22, the second ceramic layer 24, and the third ceramic layer 26 can be adjusted by changing the adding amount of the alumina cordierite. The technical significance of adjusting the CTE of the first ceramic layer 22, the second ceramic layer 24, and the third ceramic layer 26 is described below.

The electrode 27 is configured including a via filling material filling the inside of the third via hole 26x. The third via hole 26x is formed penetrating through the third ceramic layer 26 and exposing an upper surface of the third wiring layer 25. A first surface 27a of the electrode 27 is substantially flush with a first surface 26a of the third ceramic layer 26. That is, the first surface 27a of the electrode 27 is exposed at the first surface 26a of the third ceramic layer 26. The electrode 27 is electrically connected to the third wiring layer 25 exposed in the third via hole 26x. The material of the electrode 27 may be, for example, copper (Cu). Alternatively, silver (Ag) or gold (Au) may be used as the material of the electrode 27. The thickness of the electrode 27 may be, for example, approximately 5 μm.

The solder resist layer 28 is formed on the first layer of the first ceramic layer 22 in a manner covering the first wiring layer 21. The solder resist layer 28 includes an opening part 28x. The material of the solder resist layer 28 may be, for example, a photosensitive resin composition including an epoxy resin or an imide resin. The thickness of the solder resist layer 28 may be, for example, approximately 15 μm.

A metal layer or the like may be formed on the first wiring layer 21 exposed in the opening part 28x. The metal layer may be, for example, an Au layer, a Ni/Au layer (i.e. a metal layer including a Ni layer and an Au layer layered in this order), or a Ni/Pd/Au layer (i.e. a metal layer including a Ni layer, a Pd layer, and a Au layer layered in this order).

The outer connection terminal 29 is formed on the first wiring layer 21 exposed in the opening part 28x of the solder resist layer 28 of the ceramic substrate 20. In a case where the metal layer or the like is formed on the first wiring layer 21, the outer connection terminal 29 is formed on the metal layer or the like.

From a plan view, the area in which the outer connection terminal 29 is formed is expanded to an area surrounding a wiring layer 33 (serving as an electrode pad to be connected to a semiconductor chip) exposed in an opening part 34x (described below). That is, the first wiring layer 21 through the third wiring layer 25 is expanded so that the outer connection terminal 29 is positioned in a periphery surrounding an area to which a semiconductor chip is connected. Accordingly, the wiring substrate 10 has a so-called fan-out configuration.

The pitch between adjacent outer connection terminals 29 can be formed larger than the pitch (e.g., approximately 80 μm) of the wiring layer 33 (exposed in the opening part 34x). Therefore, the pitch between adjacent outer connection terminals 29 may be, for example, 400 μm. The wiring substrate 10, however, may have a so-called fan-in configuration.

The outer connection terminal 29 functions as a terminal for electrically connecting with a pad of a target substrate (not illustrated) such as a motherboard. For example, a solder ball may be used as the outer connection terminal 29. The material of the solder ball may be, for example, an alloy containing Pb, an alloy containing Sn and Cu, an alloy containing Sn and Ag, or an alloy containing Sn, Ag, and Cu. Alternatively, a lead pin may be used as the outer connection terminal 29.

Although the outer connection terminal 29 is formed in the above-described first embodiment, the outer connection terminal 29 may be omitted. That is, a portion of the first wiring layer 21 is exposed in solder resist 28 and serves as a pad for enabling, for example, the outer connection terminal 29 to be formed whenever necessary.

The silicon substrate 30 is bonded to the ceramic substrate 20 via the polymer layer 40 (i.e. so-called polymer bonding). The material of the polymer layer 40 may be a polymer insulating resin such as benzocyclobutene (BCB), polybenzooxazole (PBO), and polyimide (PI). The insulating resin is suitable from the aspect that insulating resin exhibits satisfactory results in a semiconductor manufacturing process and exhibits heat resistance beyond a temperature of 350° C.

The silicon substrate 30 includes a substrate body 31, an insulating layer 32, a wiring layer 33 including first and second metal layers 33a, 33b, a guide resist layer 34, and a third metal layer 35.

The substrate body 31 is formed of silicon. The substrate body 31 may be formed having a thickness of, for example, approximately 50-500 μm. A via hole 31z, which is formed of a via hole 31y and a via hole 40x, is a through-hole exposing the first surface 27a of the electrode 27 of the ceramic substrate 20. The via hole 31y of the via hole 31z penetrates through the substrate body 31 from a first surface 31a (front surface) of the substrate body 31 to a second surface 31b (back surface) of the substrate body 31. The via hole 40x of the via hole 31z penetrates through the polymer layer 40. Although the pitch for arranging plural of the via hole 31z may be discretionally set, the pitch may be, for example, approximately 80 μm. The via hole 31z has a round shape from a plan view (from the side of the first surface 31a of the substrate body 31 or from the side of the second surface 31b of the substrate body 31). The via hole 31z has a diameter of, for example, approximately 10-200 μm.

The insulating layer 32 is formed on the first surface 31a of the substrate body 31 and on an inner surface of the via hole 31y. The insulating layer 32 serves as an insulating film between the substrate body 31 and the wiring layer 33. A thermal oxide film ($SiO_2$) may be used as the insulating layer 32. The insulating layer 32 may have a thickness of, for example, approximately 1-2 m.

As described above, the wiring layer 33 includes the first metal layer 33a and the second metal layer 33b. Further, the wiring layer 33 is configured including a via filling material filling the inside of the via hole 31z (via holes 31y, 40x on which the insulating layer 32 is formed) and a wiring pattern formed on the first surface 31a of the substrate body 31 via the insulating layer 32. The wiring layer 33 is electrically connected to the electrode 27 of the ceramic substrate 20.

In this embodiment, the via hole 31y is formed of a concave part 31x having a larger diameter than the diameter of the first surface 27a of the electrode 27, and the via hole 40x is formed having a diameter substantially equal to the diameter of the first surface 27a of the electrode 27. Thereby, the first surface 27a of the electrode 27 contacts only the wiring layer 33 exposed at a bottom portion of the via hole 40x. Further, in this embodiment, the via holes 31y, 40x are formed in a manner that a center axis of the via holes 31y, 40x match a center axis of the first surface 27a of the electrode 27. Nevertheless, the configuration of the via holes 31y and 40x and the first surface 27a of the electrode 27 are not limited to that of the above-described embodiment.

Because the wiring layer 33 can be fabricated by performing a semiconductor manufacturing process on the substrate body 31 formed of silicon, ultra fine-sized via holes and ultra fine-sized wiring patterns can be formed in the wiring layer 33. The wiring pattern of the wiring layer 33 may be formed having a line/space of, for example, approximately 1/1 μm-10/10 μm.

The guide resist layer 34 is formed on the insulating layer 32 (formed on the first surface 31a of the substrate body 31) in a manner covering the wiring layer 33. As described above, the guide resist layer 34 includes the opening part 34x. A portion of the wiring layer 33 is exposed inside the opening part 34x of the guide resist layer 34. The exposed portion of the wiring layer 33 serves as an electrode pad to be connected to a semiconductor chip. The material of the guide resist layer 34 may be a polymer insulating resin such as benzocyclobutene (BCB), polybenzooxazole (PBO), and polyimide (PI). Alternatively, the material of the guide resist layer 34 may be, for example, a photosensitive resin composition including an epoxy resin or an imide resin. The thickness of the guide resist layer 34 may be, for example, approximately 5-30 μm.

The third metal layer 35 is formed on the wiring layer 33 exposed in the opening part 34x of the guide resist layer 34. The third metal layer 35 is for improving connection reliability when connecting a semiconductor chip to a portion of the wiring layer 33 exposed in the opening part 34x. Accordingly, in this embodiment, the third metal layer 35 does not need to be formed on a portion of the wiring layer covered by the resist layer 34. The metal layer 35 may be, for example, a Au layer, a Ni/Au layer (a Ni layer and an Au layer layered in this order), or a Ni/Pd/Au layer (a Ni layer, a Pd layer, and a Au layer layered in this order). Alternatively, the third metal layer 35 may be a solder plating of, for example, SnAg or SnAgCu. However, depending on the specification, the third metal layer 35 may not have to be formed on the portion of the wiring layer 33 exposed in the opening part 34x of the guide resist layer 34.

Accordingly, the wiring substrate 10 functions as an interposer that connects a semiconductor chip (not illustrated) and a target substrate (e.g., motherboard, not illustrated). In this embodiment, the CTE of the silicon substrate 30 is approximately 3 ppm/° C. Further, in a case where a semiconductor chip to be connected to the side of the silicon substrate 30 is formed of a silicon material, the CTE of the semiconductor chip is also approximately 3 ppm/° C. Because the CTE of the semiconductor chip and the CTE of the silicon substrate 30 substantially match, even in a case where a heating process is performed when connecting the semiconductor chip and the silicon substrate 30, thermal stress due to difference of CTE is unlikely to occur at a connecting portion between the semiconductor chip and the silicon substrate 30. Therefore, connection reliability between the semiconductor chip and the silicon substrate 30 can be improved.

In view that no problem is caused without having to match the CTE of the ceramic substrate 20 and the CTE of the silicon substrate 30 (approximately 3 ppm/° C.) and in view that the target substrate (e.g., motherboard mainly formed of resin), which is connected to the side of the ceramic substrate 20, has a CTE of approximately 18 ppm/° C., it is preferable for the ceramic substrate 20, being arranged between the silicon substrate 30 and the target substrate, to have a CTE ranging from 10 ppm/° C. to 12 ppm/° C. As described above, the CTE of each ceramic layer can be adjusted by changing the amount in which alumina cordierite is added.

Accordingly, by bonding the ceramic substrate 20 and the silicon substrate 30 via the polymer layer 40 in the above-described manner (i.e. polymer bonding), a reliable connection can be attained between the ceramic substrate 20 and the silicon substrate 30 without having to match the CTE of the ceramic substrate 20 with the CTE of the silicon substrate 30 (approximately 3 ppm/° C.). Further, by setting the CTE of the ceramic substrate 20 to a predetermined value (e.g., a value ranging from 10 ppm/° C. to 12 ppm/° C.) near the value of the CTE of the target substrate (e.g., motherboard mainly formed of resin) (e.g., a value of approximately 18 ppm/° C.), a reliable connection between the ceramic substrate 20 and the target substrate can be attained.

In a case of attaining a greater reliable connection between the ceramic substrate 20 and the target substrate, the CTE of the layers of the ceramic substrate 20 can be adjusted so that the value of the CTE of the layers of the ceramic substrate 20 gradually increase the nearer towards the target substrate (e.g., motherboard) from the layer of the ceramic substrate 20 towards the silicon substrate 30. For example, the CTE of the third ceramic layer 26 situated nearest to the silicon substrate 30 can be adjusted to a value ranging from approximately 10 ppm/° C. to 12 ppm/° C., the CTE of the first ceramic layer 22 situated nearest to the target substrate (e.g., motherboard) can be adjusted to a value ranging from approximately 15 ppm/° C. to 17 ppm/° C. The CTE of the second ceramic layer 24 situated between the first and third ceramic layers 22, 26 can be adjusted to a value ranging from approximately 13 ppm/° C. to 14 ppm/° C.

Accordingly, even in a case of performing a heating process when connecting the target substrate (e.g., motherboard) and the ceramic substrate 20, thermal stress due to difference of CTE is unlikely to occur at the connecting portion between the target substrate (e.g., motherboard) and the ceramic substrate 20 by adjusting the CTE of the layers of the ceramic substrate 20 in such manner (i.e. adjusting the CTE of the layers of the ceramic substrate 20 so that the CTE of the layers gradually increases as the layer of the ceramic substrate 20 is nearer towards the target substrate (e.g., motherboard) from the layer of the ceramic substrate 20 towards the silicon substrate 30) and substantially matching the CTE of the first ceramic layer 22 situated nearest to the target substrate with the CTE of the target substrate (e.g., motherboard). Thereby, a greater reliable connection between the ceramic substrate 20 and the target substrate (e.g., motherboard) can be attained.

For the same reason, because thermal stress due to difference of CTE is unlikely to occur at each of the connecting portions between the layers of the ceramic substrate 20, a reliable connection between the layers of the ceramic substrate 20 can be attained.

(Method for Manufacturing Wiring Substrate)

Next, a method for manufacturing the wiring substrate 10 according to the first embodiment of the present invention is described. FIGS. 5-18B are schematic diagrams illustrating steps of manufacturing the wiring substrate 10 according to the first embodiment of the present invention. In FIGS. 5-18B, like components are denoted with like reference numerals as of those of FIG. 4 and are not further explained.

First, in the step illustrated in FIG. 5, a substrate body 31S is prepared. Then, a resist layer 61 having opening parts 61x corresponding to electrodes 27 of a ceramic substrate 20S is formed on a first surface 31a of the substrate body 31S. The substrate main body 31S includes areas (regions) which are to be finally divided to become independent pieces of the substrate body 31 (see FIG. 4). A silicon wafer, which has not yet been subject to a thinning process, may be used as the substrate body 31S. The silicon wafer may have a width (diameter) of, for example, 6 inches (approximately 150 mm), 8 inches (approximately 200 mm), or 12 inches (approximately 300 mm). The silicon wafer may have a thickness of, for example, 0.625 mm (in a case of a 6 inch wafer), 0.725 mm (in a case of an 8 inch wafer), or 0.775 mm (in a case of a 12 inch wafer). It is, however, to be noted that the shape of the substrate body 31S is not limited to, for example, a silicon wafer having a circle shape from a plan view. Alternatively, the substrate body 31S may be, for example, a substrate having a rectangular shape from a plan view.

The resist layer 61 may be formed by, applying a liquid type or a paste-like resist on the first surface 31a of the substrate main body 31. The liquid type or paste-like resist may contain a photosensitive resin composition including an epoxy resin or an imide resin. Alternatively, the resist layer 61 may be formed by, laminating a film-like resist onto the first surface 31a of the substrate main body 31. Likewise, the film-like resist may contain a photosensitive resin composition including an epoxy resin or an imide resin. By exposing and developing the resist applied or laminated on the first surface 31a of the substrate main body 31, the opening parts 61x are formed in the resist layer 61. Thereby, the resist layer 61 having plural opening parts 61x can be obtained. Alternatively, a film-like resist formed with plural opening parts 61x beforehand may be laminated to the first surface 31a of the substrate main body 31.

Although the opening parts 61x are formed at positions corresponding to the electrodes 27 of the ceramic substrate 20S, the pitch of the opening parts 61x may be, for example, approximately 80 μm. The opening part 61 has a shape of a circle from a plan view (from the side of the first surface 31a of the substrate body 31S or from the side of the second surface 31b of the substrate body 31S). The diameter of the opening part 61 may range from, for example, 10 to 200 μm. In this embodiment, the diameter of the opening part 61x is larger than the diameter of the first surface 27a of the electrode 27.

Then, in the step illustrated in FIG. 6, concave parts 31x are formed in the substrate body 31S by etching the substrate body 31S with use of the resist layer 61 (see FIG. 5) as a mask. Then, the resist layer 61 is removed. Thereby, the concave parts 31x can be formed at positions corresponding to the electrodes 27 of the ceramic substrate 20S. The concave parts 31x can be formed by performing an anisotropic etching process (e.g., DRIE (Deep Reactive Ion Etching) using $SF_6$) on the substrate body 31S. The pitch of the concave parts 31x corresponds to the pitch of the opening parts 61x. For example, the pitch of the concave parts 31x may be approximately 80 µm. The concave parts 31x have a circle shape from a plan view (from the side of the first surface 31a of the substrate body 31S). The diameter of the circle is the diameter of the concave part 61x. The diameter of the concave part 61 may be, for example, approximately 10-200 µm. The concave part 31x is formed with a depth that allows a through-hole (via hole 31y) to be formed therein (described below with FIG. 8).

Figure 7:
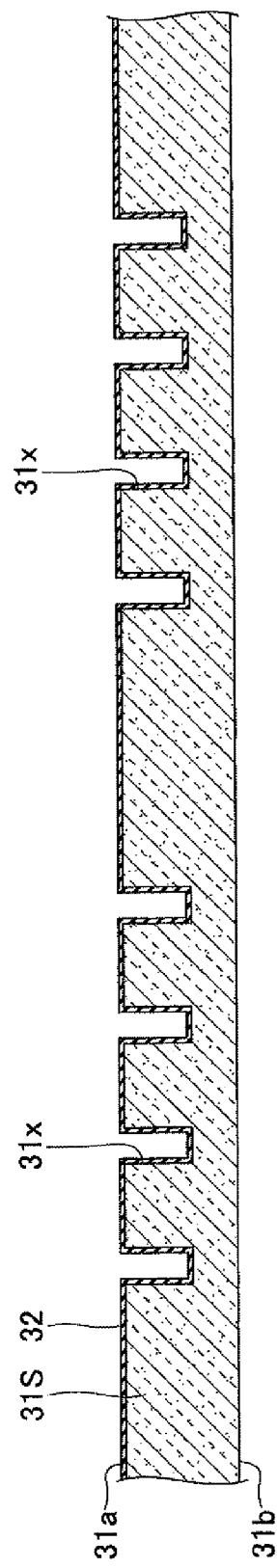
FIG. 7 is a schematic diagram for describing steps of manufacturing the wiring substrate according to the first embodiment of the present invention (part 3)

Then, in the step illustrated FIG. 7, an insulating layer 32 is formed on the first surface 31a of the substrate body 31S, an inner surface of the concave parts 31x, and a bottom surface of the concave parts 31x. The insulating layer 32 may be a thermal oxide layer ($SiO_2$). Accordingly, the insulating layer 32 is formed by thermally oxidizing the surface of the substrate body 31S. For example, a wet thermal oxidization method may be used where the vicinity of the surface of the substrate body 31S is heated, for example, at a temperature equal to or higher than 1000° C. The thickness of the insulating layer 32 may be, for example, approximately 1-2 µm.

By forming the insulating layer 32 with the wet thermal oxidization method, the process of manufacturing the wiring substrate 10 can be simplified and the cost of manufacturing the wiring substrate 10 can be reduced compared to applying an insulating material using, for example, a spin coating method. Forming the insulating layer 32 with the wet thermal oxidization method is suitable because the insulating layer 32 can be formed with greater thickness compared to forming the insulating layer 32 with a dry thermal oxidization method.

In a case where improvement of insulating property is desired or in a case where reduction of insertion loss is desired, it is preferable to form an insulating layer containing benzocyclobutene by using, for example, a spin-coating method. Forming an insulating layer containing benzocyclobutene by using, for example, a spin-coating method enables the insulating layer 32 to be formed with greater thickness compared to forming the insulating layer 32 by using a thermal oxidization method. By increasing the thickness of the insulating layer 32, electrostatic capacity between the substrate body 31 and the wiring layer 33 can be reduced and insertion loss can be reduced.

Figure 8:
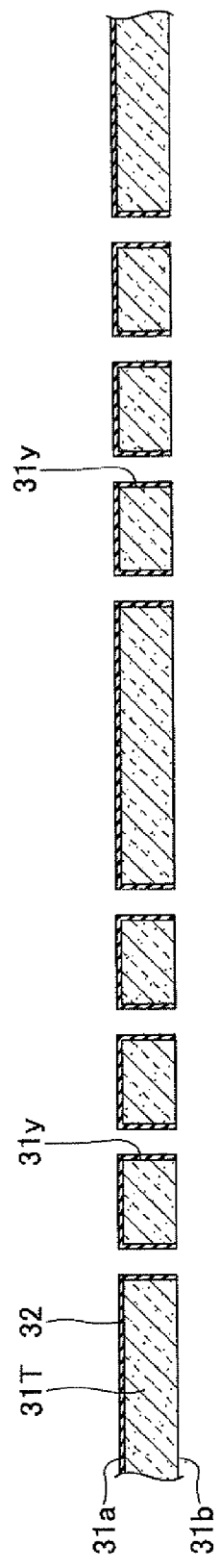
FIG. 8 is a schematic diagram for describing steps of manufacturing the wiring substrate according to the first embodiment of the present invention (part 4)

Then, in the step illustrated FIG. 8, the thickness of the substrate body 31S is reduced by polishing or grinding the second surface 31b of the substrate body 31S. By reducing the thickness of the substrate body 315, the concave parts 31x illustrated in FIG. 7 are penetrated. As a result, via holes (also referred to as "first via holes") 31y are formed in positions corresponding to the electrodes 27 of the ceramic substrate 20S. The via hole 31y penetrates the substrate body 31S from the first surface 31a to the second surface 31b. The via hole 31v includes a via hole part 31v having an inner side surface on which an insulating layer 32 is formed. The thickness of the substrate body 31S can be reduced by using, for example, a back side grinder. The substrate body 31S after being subject the thickness reduction is hereinafter referred to as "substrate body 31T". The substrate body 31T may be formed having a thickness of, for example, 50-500 µm. After performing the thickness reduction on the substrate body 31S, an insulating layer may be formed on the polished or ground surface of the substrate body 31S (second surface 31b of the substrate body 31T) with a thermal oxidation method.

Figure 9:
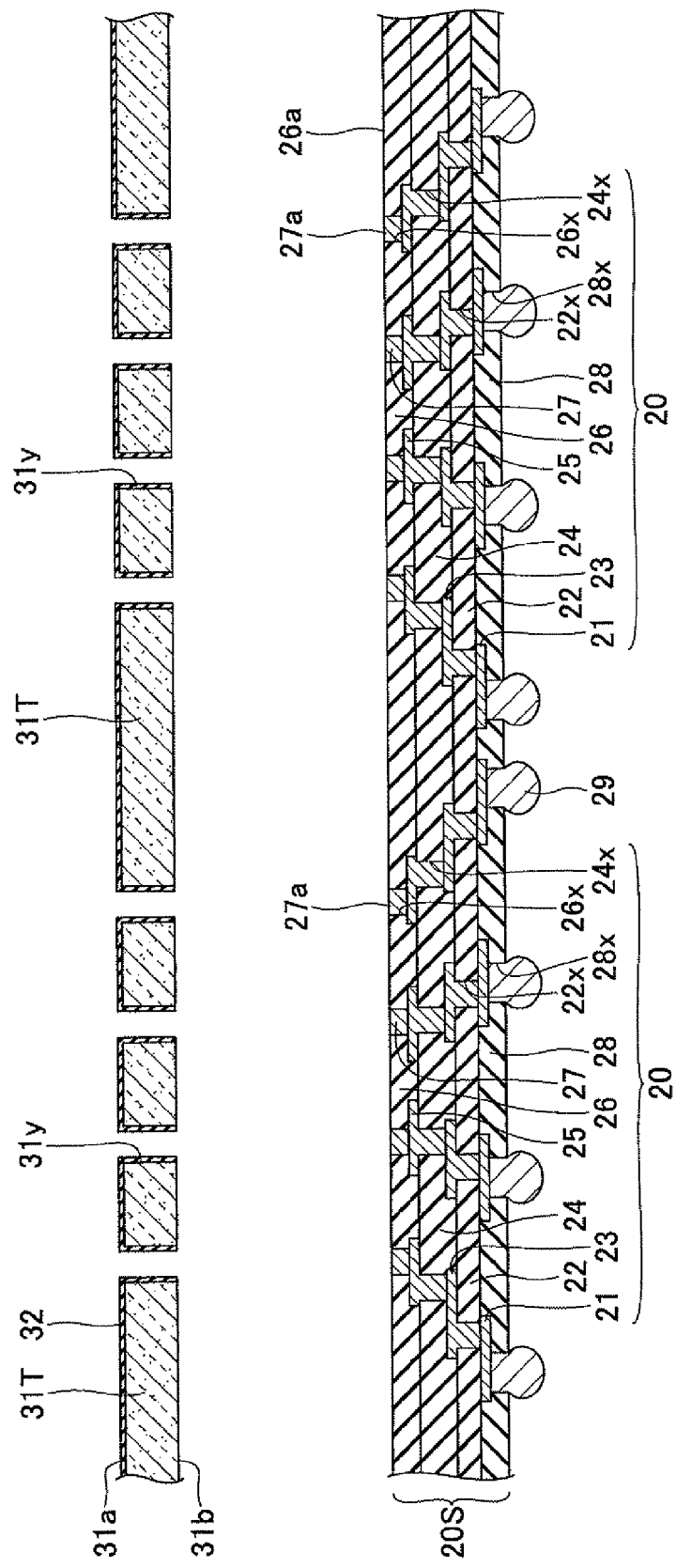
FIG. 9 is a schematic diagram for describing steps of manufacturing the wiring substrate according to the first embodiment of the present invention (part 5)

Then, in the step illustrated FIG. 9, the ceramic substrate 20S is prepared. The ceramic substrate 20S includes areas (regions) which are to be finally divided to become independent pieces of the ceramic substrate 20 (see FIG. 4). The ceramic substrate 20 is a multilayered substrate formed of LTCC (Low Temperature Co-Fired Ceramic). Although the ceramic substrate 20S is illustrated having outer connection terminals 29 provided thereto, the outer connection terminals do not need to be provided at the step of FIG. 9 and may be provided when necessary.

The material of each ceramic layer of the ceramic substrate 20S may be, for example, a glass containing sodium oxide ($Na_2O$), aluminum oxide ($Al_2O_3$), boron oxide ($B_2O_3$), or silicon dioxide ($SiO_2$) added with alumina-cordierite. The ceramic substrate 20S may have a circle shape from a plan view. The circle-shaped ceramic substrate 20 may have a width (diameter) of, for example, 6 inches (approximately 150 mm), 8 inches (approximately 200 mm), or 12 inches (approximately 300 mm). The ceramic substrate 20S may have a thickness of, for example, approximately 50-1000 µm.

The ceramic substrate 20S may be fabricated as follows. First, a material having a powder of glass containing sodium oxide ($Na_2O$), aluminum oxide ($Al_2O_3$), boron oxide ($B_2O_3$), or silicon dioxide ($SiO_2$) added with a powder of alumina-cordierite is prepared. Then, an organic binder and a solvent are added to the material having the glass powder added with the alumina-cordierite powder. Then, a slurry is obtained by kneading the organic binder, the solvent, and the material having the glass powder added with the alumina-cordierite powder. The slurry is applied (deposited) to a carrier tape by using a film deposition apparatus. The slurry deposited on the carrier becomes a green sheet after being dried in a drying zone. The green sheet is cut into a predetermined size. Then, the green sheet is perforated in positions (areas) at which via holes are to be subsequently formed. Then, a via filling material and a wiring pattern (conductive material) are printed onto the green sheet. Then, plural of such green sheets are layered on top of each other. Then, by sintering the plural green sheets, the ceramic substrate 20S is obtained.

Figure 10:
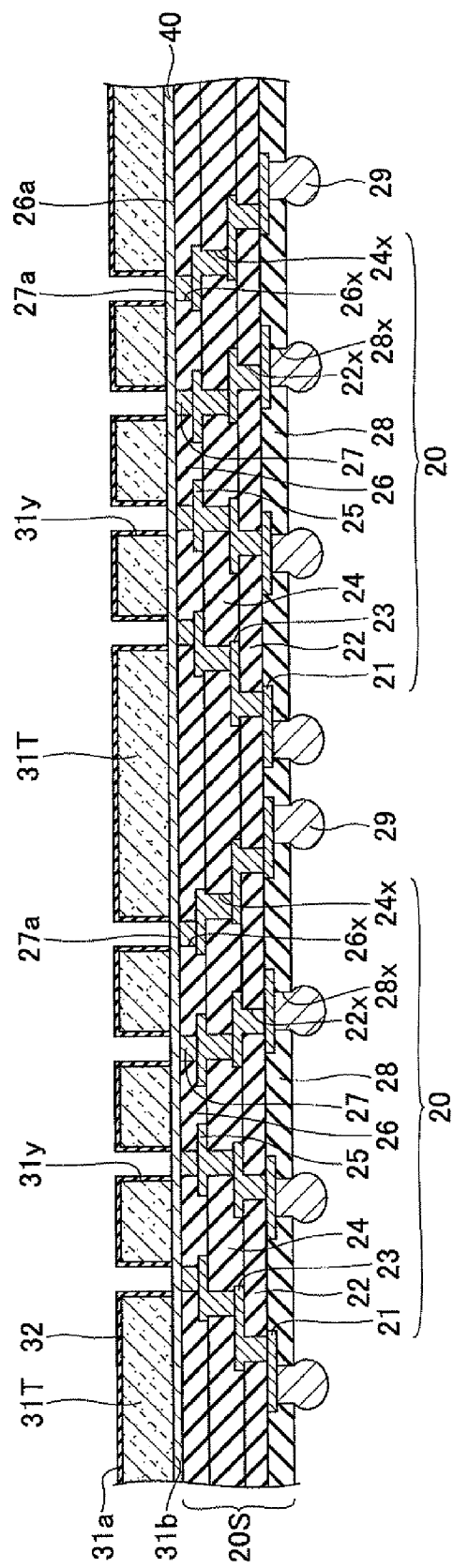
FIG. 10 is a schematic diagram for describing steps of manufacturing the wiring substrate according to the first embodiment of the present invention (part 6)

Then, in the step illustrated FIG. 10, the ceramic substrate 20S and the substrate body 31S are adhered to each other via a polymer layer 40. The material of the polymer layer 40 is a polymer insulating resin such as benzocyclobutene (BCB), polybenzooxazole (PBO), or polyimide (PI). A paste-like polymer insulating resin (e.g., benzocyclobutene (BCE), polybenzooxazole (PBO), or polyimide (PI)) is applied (e.g., spin-coated) to either the first surface 26a of the ceramic substrate 20S or the second surface 31b of the substrate body 31T. Alternatively, a film-like polymer insulating resin (e.g., benzocyclobutene (BCB), polybenzooxazole (PBO), or polyimide (PI)) may be laminated to either the first surface 26a of the ceramic substrate 20S or the second surface 31b of the substrate body 31T. The ceramic substrate 20S and the substrate body 31T are adhered to each other via the polymer layer 40 in a manner that the position of the center of the electrodes 27 of the ceramic substrate 20S matches the position of the center of the via holes 31y of the substrate body 31T. Because the polymer layer 40 in an uncured state is viscous, the ceramic substrate 20S and the substrate body 31T can be temporarily adhered to each other via the polymer layer 40.

Alternatively, a film-like polymer insulating resin (benzocyclobutene (BCB), polybenzooxazole (PBO), or polyimide (PI)) having opening parts corresponding to the positions of the via holes 31y may be laminated as the polymer layer 40 to either the first surface 26a of the ceramic substrate 20S or the second surface 31b of the substrate body 31T. In this case, the first surface 27a of the electrodes 27a are exposed in the opening parts of the polymer layer 40 and in the via holes 31y.

Figure 11:
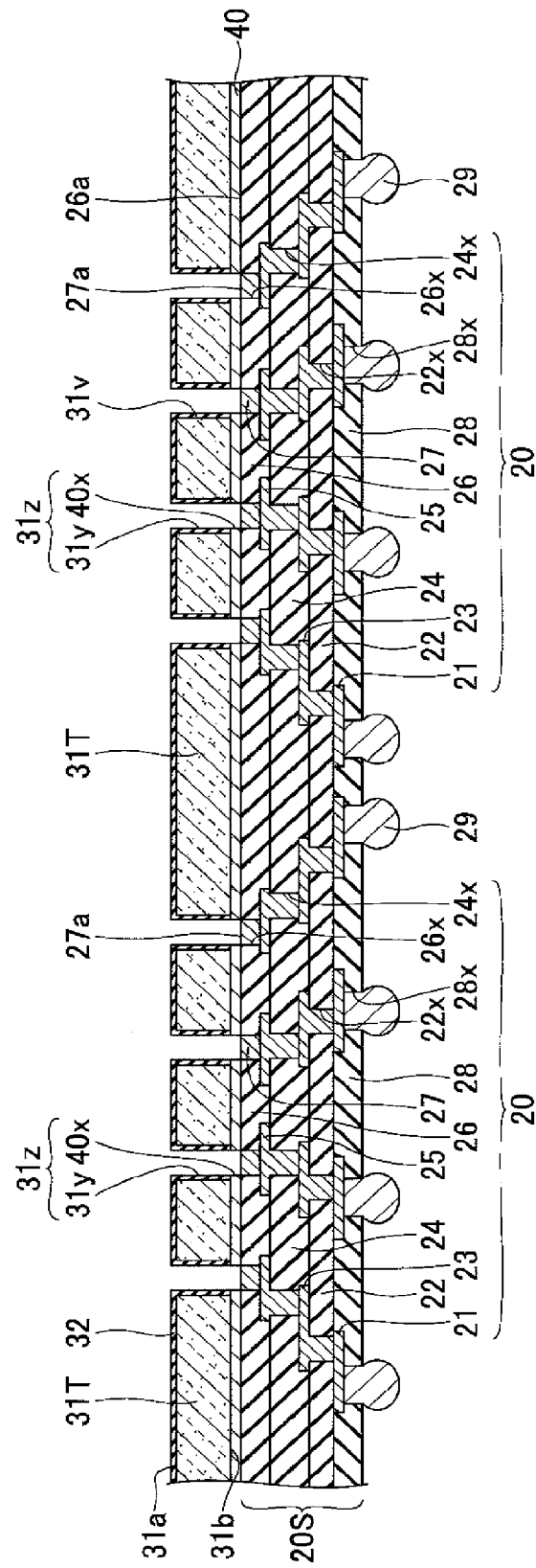
FIG. 11 is a schematic diagram for describing steps of manufacturing the wiring substrate according to the first embodiment of the present invention (part 7)

Then, in the step illustrated FIG. 11, via holes (also referred to as "second via holes") 40x are obtained by removing the polymer layer 40 exposed in the via holes 31y. Thereby, the first surface 27a of the electrodes 27 become exposed. Then, the polymer layer 40 is cured by being heated at a temperature of approximately 250° C.-350° C. Thereby, the ceramic substrate 20S and the substrate body 31T are bonded via the polymer layer 40 (i.e. polymer bonding). Thereby, the via hole 31y continues to the via holes 40x formed in the polymer layer 40. As illustrated in FIG. 11, the via hole 31y and the via hole 40x have diameters that are substantially equal to each other. As a result, the via hole 31y and the via hole 40x form a continuous through-hole having the insulating layer 32 formed on an inner side surface of the through-hole. The through-hole is referred to as a via hole 31z.

In a case where a positive type photosensitive insulating resin is used as the material of the polymer layer 40, the via hole 40x can be formed by removing the polymer layer 40 exposed in the via hole 31y. The polymer layer 40 exposed in the via hole 31y is removed by irradiating, for example, UV light to the polymer layer 40 exposed in the via hole 31y where the substrate body 31T is used as a mask and developing the polymer layer 40 exposed in the via hole 31y. Alternatively, a non-photosensitive insulating resin may be used as the material of the polymer layer 40. The via hole 40x is formed by removing the polymer layer 40 exposed in the via hole 31y. In this case, the polymer layer 40 exposed in the via hole 31y is removed by irradiating, for example, a laser beam (e.g., $CO_2$ laser) to the polymer layer 40 exposed in the via hole 31y. In this case, however, residue may remain on the first surface 27a of the electrode 27 exposed in the via hole 40x of the polymer layer 40. Therefore, a cleaning process is to be performed on the first surface 27a of the electrode 27 inside the via hole 40x of the polymer layer 40.

It is to be noted that the step illustrated in FIG. 11 may be omitted in a case where a film-like polymer insulating resin (benzocyclobutene (BCB), polybenzooxazole (PBO), or polyimide (PI)) having opening parts corresponding to the positions of the via holes 31y is laminated as the polymer layer 40 to either the first surface 26a of the ceramic substrate 20S or the second surface 31b of the substrate body 31T in the step illustrated in FIG. 10.

Figure 12:
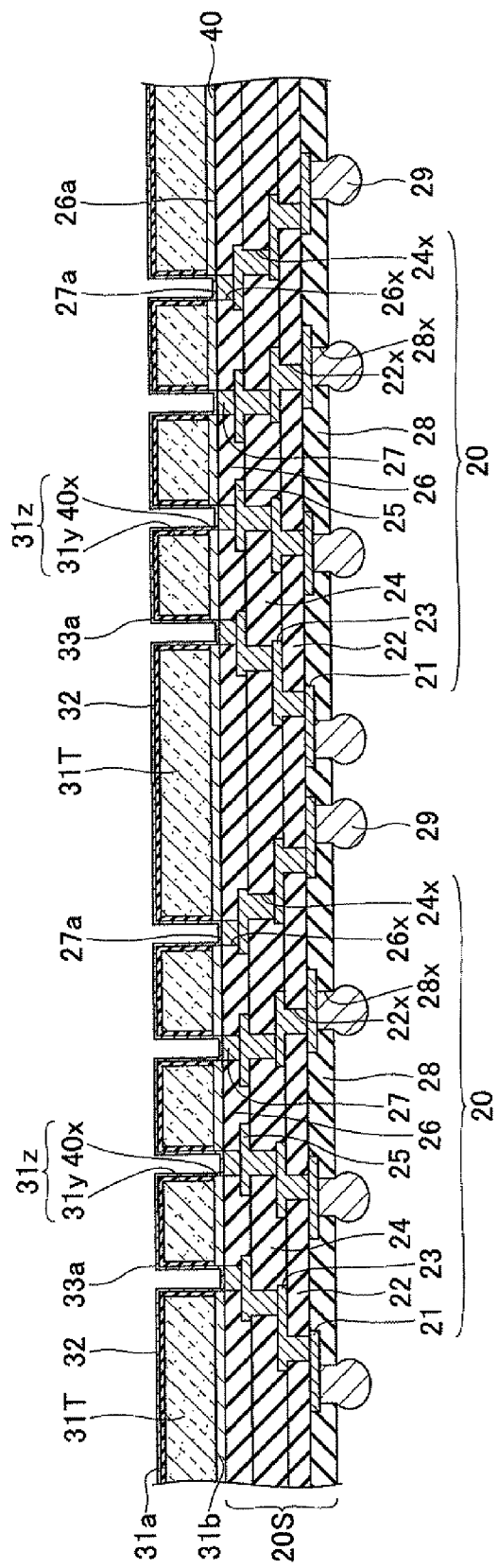
FIG. 12 is a schematic diagram for describing steps of manufacturing the wiring substrate according to the first embodiment of the present invention (part 8)
Figure 13:
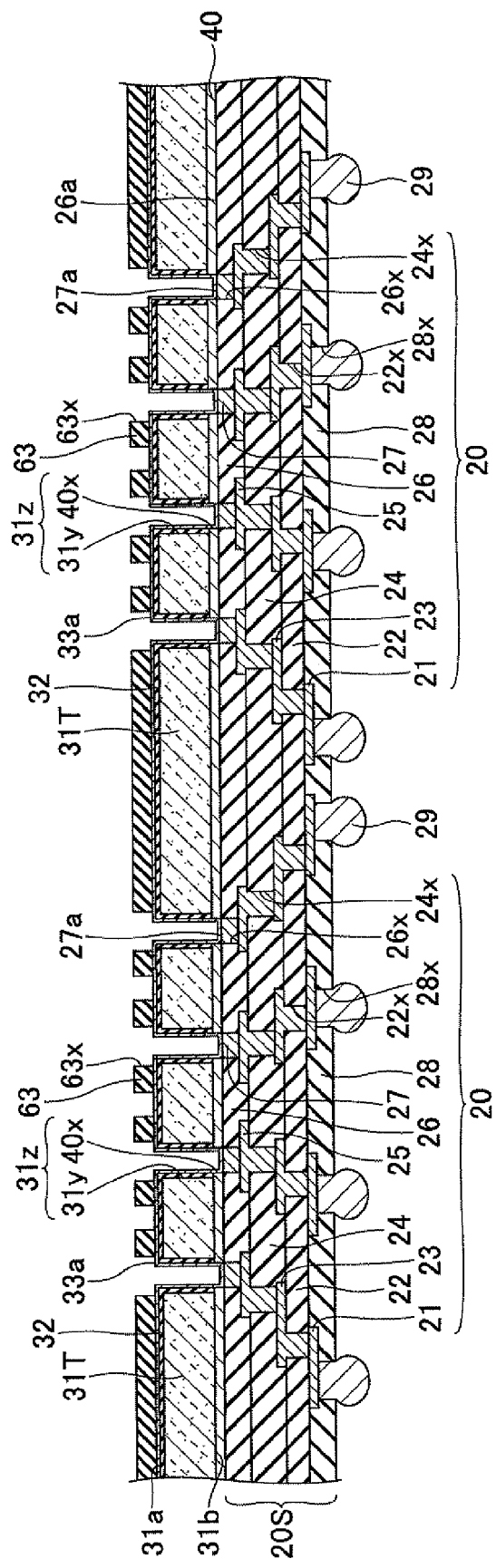
FIG. 13 is a schematic diagram for describing steps of manufacturing the wiring substrate according to the first embodiment of the present invention (part 9)

Then, in the step illustrated FIG. 12, after the polymer layer 40 is cured at a temperature of approximately 250° C.-350° C., a first metal layer 33a is formed on the first surface 27a of the electrode 27 exposed in the via hole 31z, the insulating layer 32 (including the insulating layer 32 covering the inner surface of the via hole 31y), and the inner surface of the via hole 40x. The first metal layer 33a is formed, for example, by a sputtering method. The first metal layer 33a may be, for example, a Ti/Cu layer (i.e. a metal layer, including a Ti layer and a Cu copper layered in this order) or a Cr/Cu layer (i.e. a metal layer including a Cr layer and a Cu layer layered in this order). For example, regarding each layer of the first metal layer 33a, the Ti layer may be formed having a thickness of approximately 0.1-0.2 μm, the Cr layer may be formed having a thickness of approximately 0.05-0.1 μm, and the Cu layer may be formed having a thickness of approximately 0.1-0.5 μm.

Then, in the step illustrated FIG. 11, a resist layer 63 having opening parts 63x corresponding to the wiring layer 33 is formed on the first metal layer 33a. More specifically, the resist layer 63 may be formed by, applying a liquid type or a paste-like resist on the first metal surface 33a. The liquid type or paste-like resist may contain a photosensitive resin composition including an epoxy resin or an imide resin. Alternatively, the resist layer 63 may be formed by, laminating a film-like resist onto the first metal surface 33a. Likewise, the film-like resist may contain a photosensitive resin composition including an epoxy resin or an imide resin. By exposing and developing the resist applied or laminated on the first metal surface 33a, the opening parts 63x are formed in the resist layer 63. Thereby, the resist layer 63 having plural opening parts 63x can be obtained. Alternatively, a film-like resist formed with plural opening parts 63x beforehand may be laminated to the first metal surface 33a.

Figure 14:
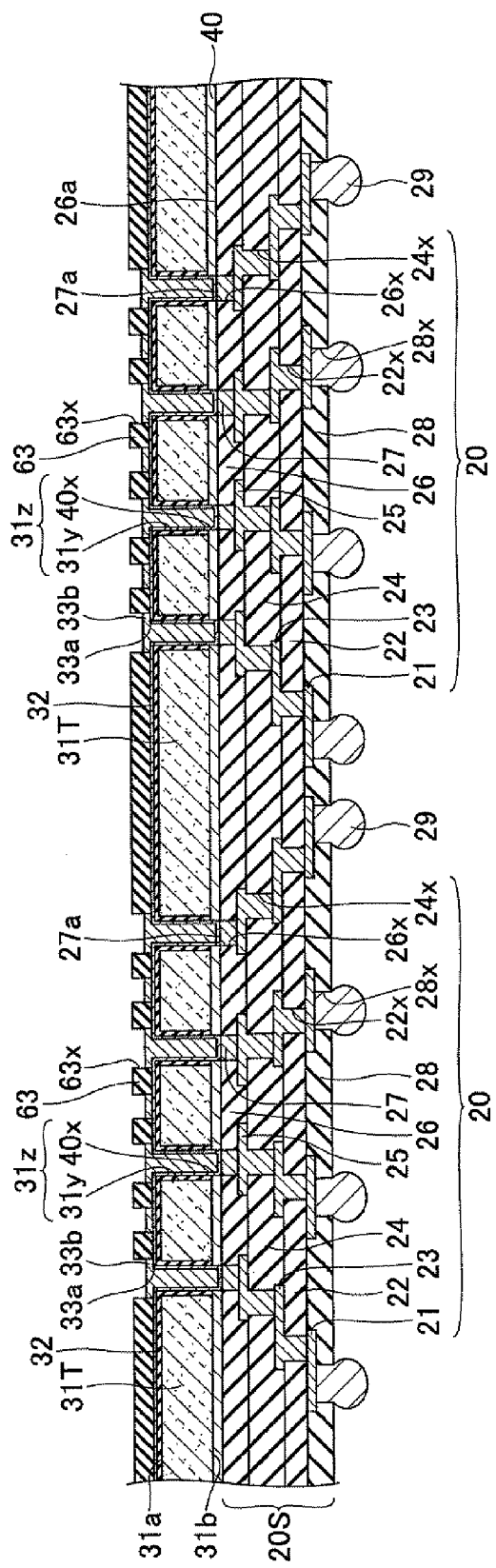
FIG. 14 is a schematic diagram for describing steps of manufacturing the wiring substrate according to the first embodiment of the present invention (part 10)

Then, in the step illustrated FIG. 14, the second metal layer 33b is formed on the first metal surface 33a exposed in the opening parts 63x. The second metal layer 33b is formed, for example, by performing an electroplating method using the first metal layer 33a as the power feed layer. The second metal layer 33b may be, for example, a Cu layer.

Figure 15:
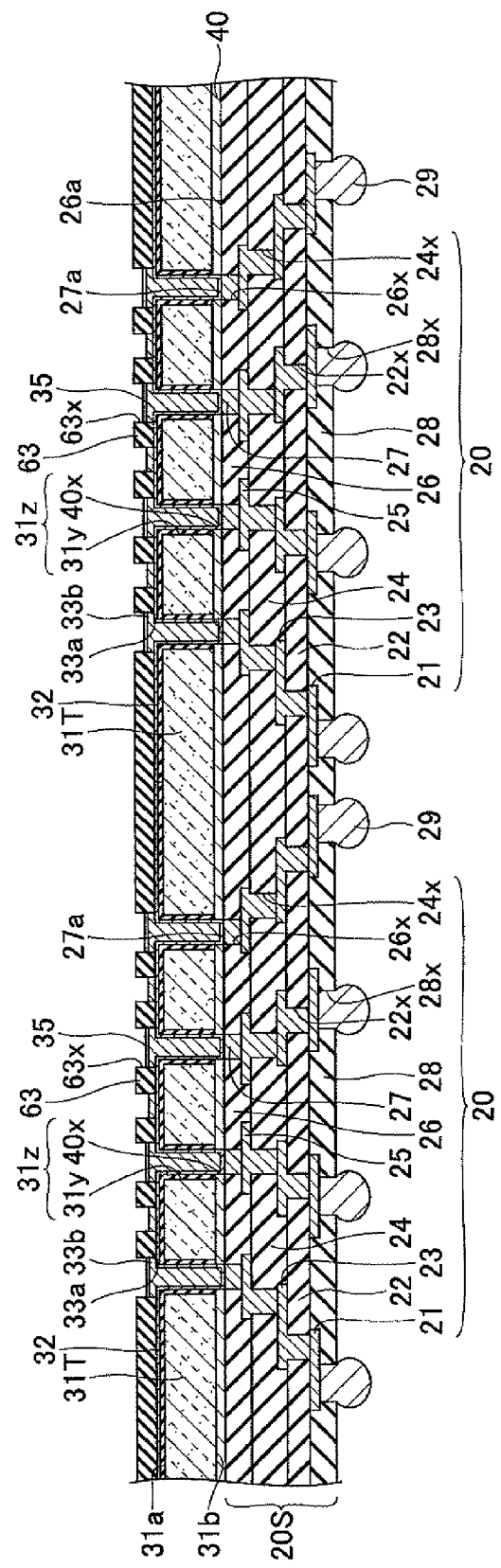
FIG. 15 is a schematic diagram for describing steps of manufacturing the wiring substrate according to the first embodiment of the present invention (part 11)

Then, in the step illustrated FIG. 15, the third metal layer 35 is formed on the second metal layer 33b. The third metal layer 35 is formed, for example, by performing an electroplating method using the first metal layer 33a as the power feed layer. The third metal layer 35 may be, for example, an Au layer, a Ni/Au layer (i.e. a metal layer including a Ni layer and an Au layer layered in this order), or a Ni/Pd/Au layer (i.e. a metal layer including a Ni layer, a Pd layer, and a Au layer layered in this order). Alternatively, the third metal layer 33b may be, for example, a solder plating layer such as a SnAg layer or a SnAgCu layer. However, depending on the specification, the third metal layer 35 may not have to be formed on the second metal layer 33b. The third metal layer 35 may be formed having a thickness of, for example, approximately 0.5-5 μm.

The third metal layer 35 is provided for improving connection reliability between the wiring layer 33 and a semiconductor chip. Therefore, the third metal layer 35 does not need to be formed at a portion of the below-described guide resist layer 34 that is not exposed in a final step. Accordingly, it is preferable to form the third metal layer 35 after masking the wiring layer 33 at the portion of the below-described guide resist layer 34 that is not exposed in a final step. Thereby, the cost of the material (e.g., Au) used for the third metal layer 35 can be reduced.

Figure 16:
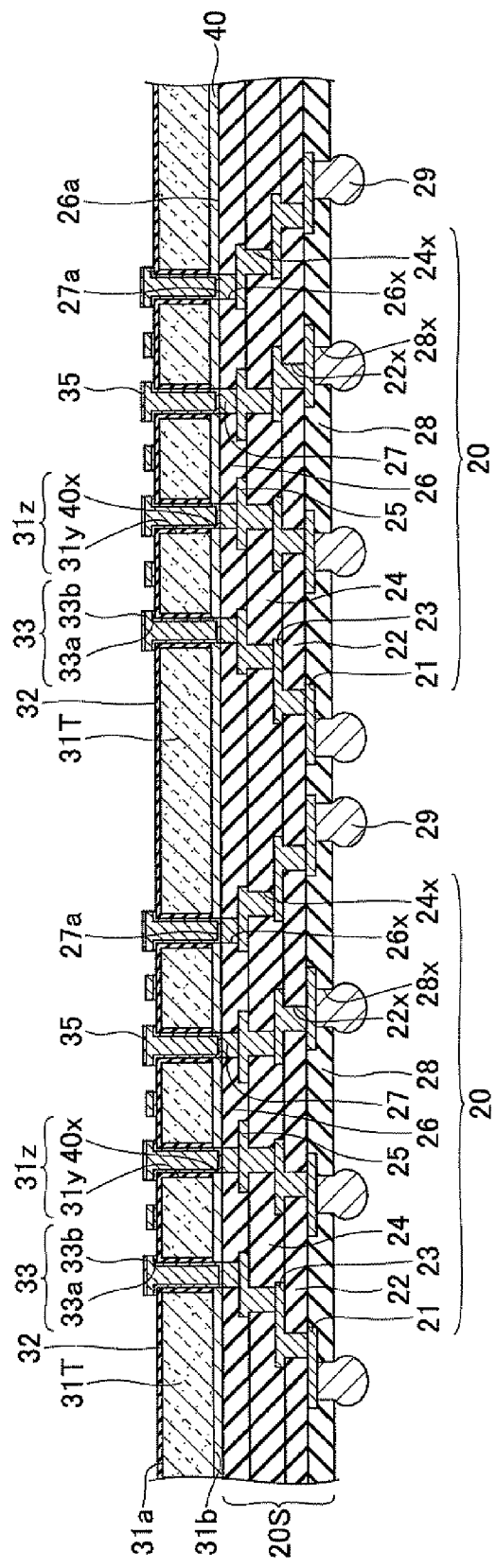
FIG. 16 is a schematic diagram for describing steps of manufacturing the wiring substrate according to the first embodiment of the present invention (part 12)

Then, in the step illustrated FIG. 16, after removing the resist layer 63 of FIG. 15, the first metal layer 33a is etched by using the second metal layer 33b as a mask, so that a portion not covered by the second metal layer 33b is removed. As a result, the wiring layer 33 including the first and second metal layers 33a, 33b is obtained. The wiring layer 33 is configured including a via filling material filling the inside of the via holes 31y, 40x on which the insulating layer 32 is formed and a wiring pattern formed on the first surface 31a of the substrate body 31 via the insulating layer 32.

The wiring pattern of the wiring layer 33 is formed having a line/space of, for example, approximately 1/1 μm-10/10 μm. The wiring pattern of the wiring layer 33 is formed having a thickness of, for example, approximately 1-10 μm (line/space=1/1 μm-10/10 μm). The wiring layer 33 may be formed using, for example, a semi-additive method. It is, however, to be noted that other methods such as a subtractive method may be used to form the wiring layer 33.

Because the silicon substrate 30 is not multilayered and only includes the wiring layer 33, manufacture can be achieved with reduced facility investment cost and high yield.

As a result, manufacturing cost of the wiring substrate 10 including the silicon substrate 30 and the ceramic substrate can be reduced.

Figure 17:
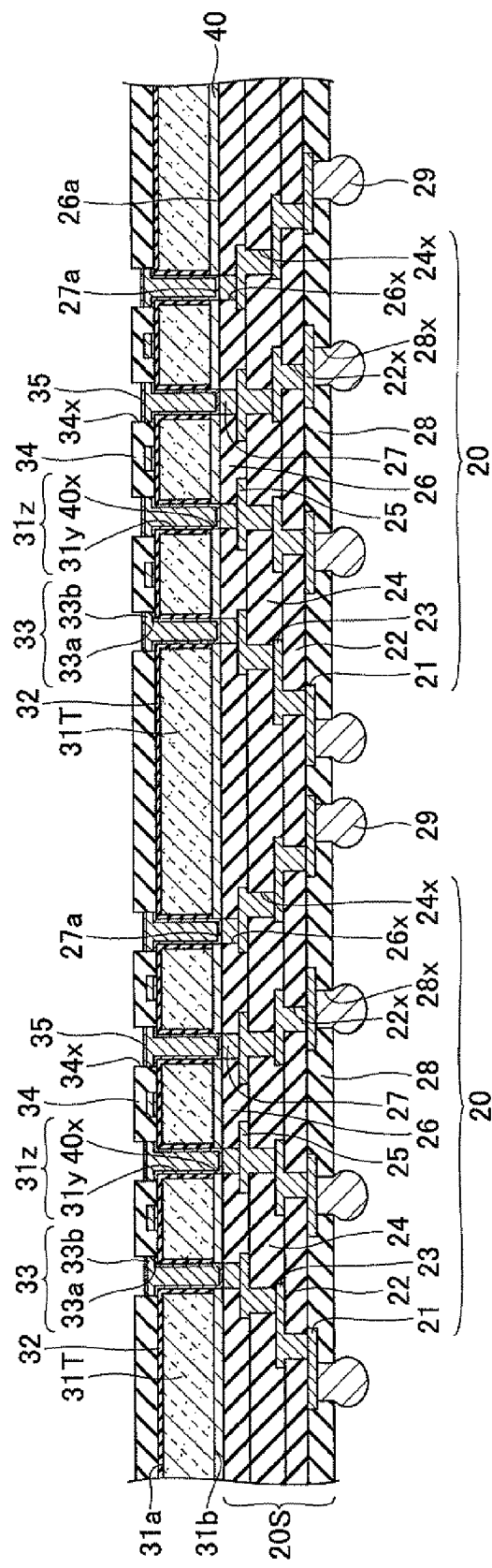
FIG. 17 is a schematic diagram for describing steps of manufacturing the wiring substrate according to the first embodiment of the present invention (part 13)

Then, in the step illustrated FIG. 17, a guide resist layer 34 having opening parts 34x exposing the third metal layer 35 is formed on the insulating layer 32 on the first surface 31a of the substrate body 31T. More specifically, the opening parts 34x of the guide resist layer 34 are formed by arranging a mask on the third metal layer 32, applying (e.g., spin-coating) an insulating resin (e.g., benzocyclobutene (BCB), polybenzooxazole (PBO), or polyimide (PI)) on the third metal layer 32, curing the insulating resin, and removing the mask on the third metal layer 35. As a result, the guide resist layer 34 having the opening parts 34x is obtained. In this state, the third metal layer 35 is exposed in the opening parts 34x of the guide resist layer 34. The guide resist layer 34 may be formed having a thickness of, for example, approximately 2-30 μm.

The material of the guide resist layer 34 may be, for example, a photosensitive resin composition including an epoxy resin or an imide resin. In the case of using the photosensitive resin composition, solder resist containing the photosensitive resin composition is applied to the insulating layer 32 formed on the first surface 31a of the substrate body 31 in a manner covering the wiring layer 33 and the third wiring layer 35. Then, by exposing and developing the solder resist, the opening parts 34x are formed. As a result, the guide resist layer 34 having the opening parts 34x is obtained.

Figure 18A:
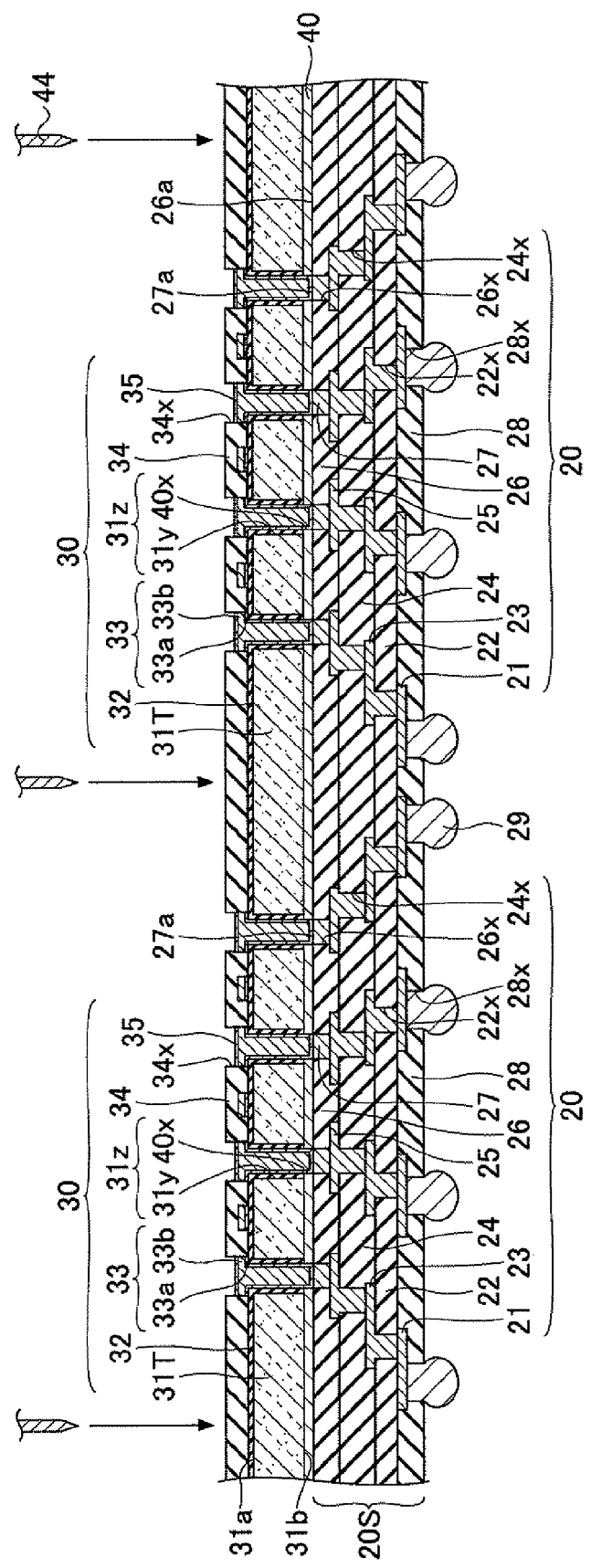
FIGS. 18A and 18B are schematic diagrams for describing steps of manufacturing the wiring substrate according to the first embodiment of the present invention (part 14)
Figure 18B:
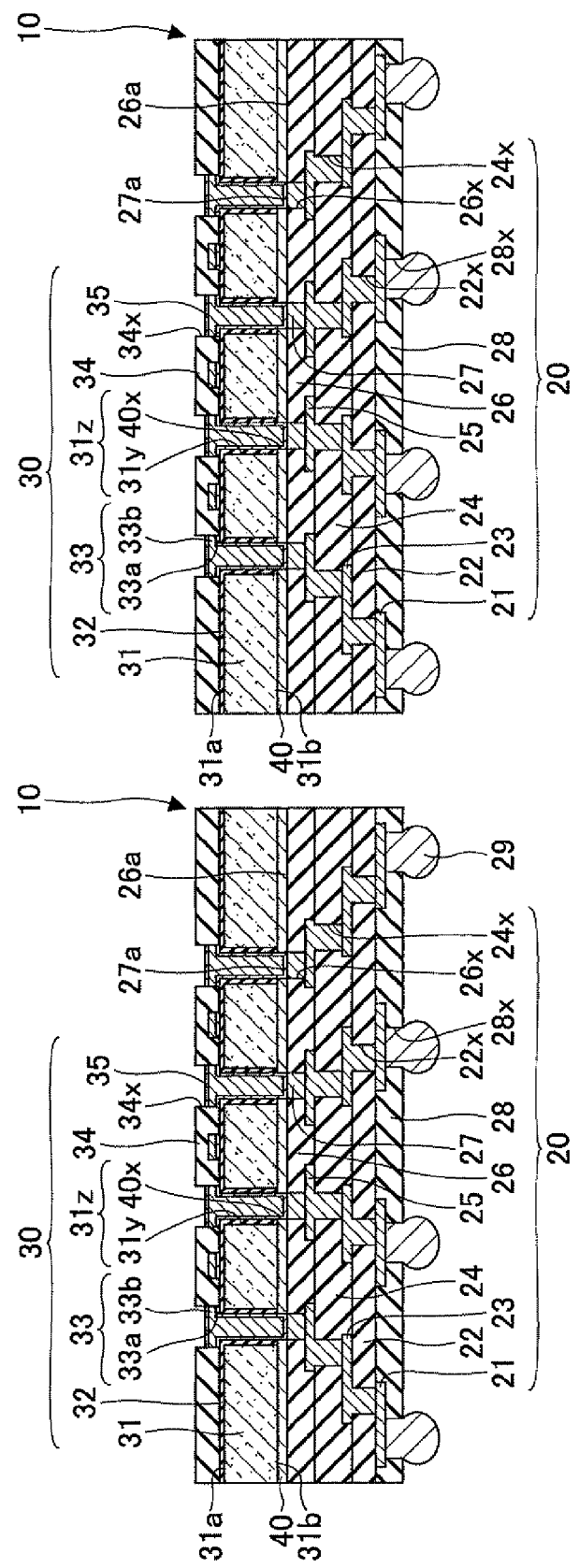

Then, in the step illustrated FIGS. 18A and 18B, the configuration illustrated in FIG. 17 is divided into independent pieces by cutting a predetermined area (region) of the configuration illustrated in FIG. 17. Thereby, manufacturing of the wiring substrate 10 including the ceramic substrate 20 and the silicon substrate 30 (illustrated in FIG. 4) according to the first embodiment of the present invention is completed. The cutting of the configuration illustrated in FIG. 17 may be performed by, for example, dicing with a dicing blade 44. The predetermined area (region) is the boundary between the areas (regions) of the ceramic substrate 31S, the substrate main body 31T, and the polymer layer 40 corresponding to the plural ceramic substrate 20. The substrate main body 31S includes areas (regions) which are to be finally divided to become independent pieces of the substrate body 31 (see FIG. 4). By dicing the substrate body 31T, the substrate body 31 is obtained.

In the above-described first embodiment of the present invention, there is provided a ceramic substrate including plural ceramic layers and an inner wiring (wiring layer) and having electrodes electrically connected to the inner wiring and exposed from one side of the ceramic substrate. Further, there is provided a silicon substrate body including a front surface (first surface) and a back surface (second surface) on the side opposite of the front surface and having an insulating layer formed on the front surface of the silicon substrate body and via holes (with the insulating layer formed on an inner surface thereof) formed in positions corresponding to the electrodes of the ceramic substrate. Further, a polymer layer is formed on the first surface of the ceramic substrate or the back surface of the silicon substrate body. The first surface of the ceramic substrate and the back surface of the substrate body are adhered to each other via the polymer layer in a manner that the position of the electrodes of the ceramic substrate matches the position of the via holes of the substrate body.

Further, the electrodes of the ceramic substrate are exposed by removing the polymer layer exposed in the via holes and forming through-holes in the polymer layer. Further, via filling material, which is electrically connected to the electrodes of the ceramic substrate, is provided by filling the via holes of the insulating layer and the through-holes of the polymer layer with a conductive material. Further, a wiring pattern, which is electrically connected to the via filling material, is formed on the front surface of the substrate body. Accordingly a silicon substrate having a wiring layer including the via filling material and the wiring pattern can be manufactured.

As a result, in manufacturing a wiring substrate including a silicon substrate and a ceramic substrate, the silicon substrate can be formed having ultra fine-size via holes and an ultra fine-size wiring pattern and the ceramic substrate can be formed having plural layers with high rigidity and satisfactory thermal conductivity at a low cost.

Because the silicon substrate is not multilayered and only includes the wiring layer, manufacture can be achieved with reduced facility investment cost and high yield. As a result, manufacturing cost of the wiring substrate including the silicon substrate and the ceramic substrate can be reduced. Accordingly, an interposer compatible to a fine-size semiconductor chip can be, manufactured by using the wiring substrate as an interposer when connecting a semiconductor chip to a target substrate (e.g., motherboard).

Further, connection reliability between the ceramic substrate and the silicon substrate can be attained without matching the CTE of the ceramic substrate with the CTE of the silicon substrate (approximately 3 ppm/° C.) by bonding the ceramic substrate and the silicon substrate via the polymer layer (i.e. polymer bonding). Further, by setting the CTE of the ceramic substrate to a predetermined value (e.g., a value ranging from 10 ppm/° C. to 12 ppm/° C.) near the value of the CTE of the target substrate (e.g., motherboard mainly formed of resin) (e.g., a value of approximately 18 ppm/° C.), a reliable connection between the ceramic substrate and the target substrate can be attained.

Further, thermal stress due to difference of CTE is unlikely to occur at the connecting portion between the target substrate (e.g., motherboard) and the ceramic substrate by setting the CTE of a ceramic layer situated far from the silicon substrate with a value greater than the CTE of another ceramic layer situated near the silicon substrate and setting the CTE of a ceramic layer situated far from the silicon substrate with a value near the CTE of the target substrate (e.g., motherboard). Accordingly, the connection reliability between the ceramic substrate and the target substrate (e.g., motherboard) can be further improved in a case of using the wiring substrate of the first embodiment as an interposer between a semiconductor chip and the target substrate (e.g., motherboard).

Further, in a case of manufacturing a semiconductor package having a semiconductor chip mounted on the wiring substrate of the first embodiment of the present invention, the semiconductor chip is mounted on a silicon substrate. In this case, when the semiconductor chip is formed of silicon, the CTE of the semiconductor chip and the CTE of the silicon substrate are substantially equal. Therefore, thermal stress due to difference of CTE is unlikely to occur at the connecting portion between the silicon chip and the silicon substrate. Because sufficient connection reliability between the semiconductor chip and the silicon substrate can be attained, an underfill resin does not need to be provided between the semiconductor chip and the silicon substrate when manufacturing the semiconductor package.

Further, by using the thermal oxidation method (e.g., wet thermal oxidation method) for forming the insulating layer insulating the substrate body and the wiring pattern, the process of manufacturing the wiring substrate can be simplified and the cost of manufacturing the wiring substrate can be

17 reduced compared to applying an insulating material using, for example, a spin coating method.

Second Embodiment

Next, a method for manufacturing the wiring substrate 10 illustrated in FIG. 4 according to a second embodiment of the present invention is described. FIGS. 19-23B are schematic diagrams illustrating steps of manufacturing the wiring substrate 10 according to the second embodiment of the present invention. In FIGS. 9-23B, like components are denoted with like reference numerals as of those of FIG. 4 and are not further explained.

Figure 19:
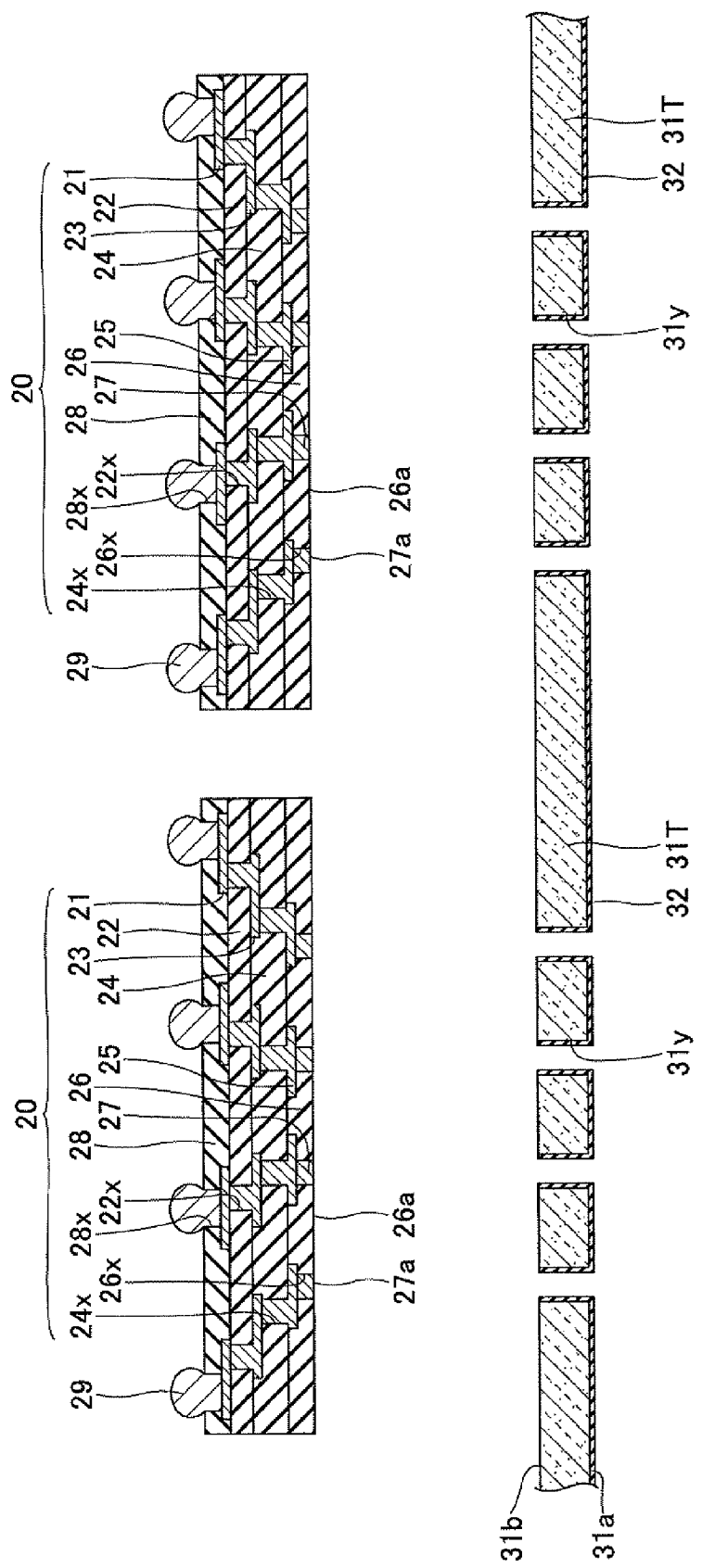
FIG. 19 is a schematic diagram for describing steps of manufacturing a wiring substrate according to a second embodiment of the present invention (part 1)

First, in the step illustrated in FIG. 19, a substrate body 31T is prepared by performing the steps illustrated in FIGS. 5-8 of the first embodiment of the present invention. The substrate body 31T has an insulating layer 32 formed on the first surface 31a of the substrate body 31T and an inner side surface of the via holes 31y. The substrate body 31T may be formed having a thickness of, for example, approximately 50-500 µm. Further, plural independent ceramic substrates 20, which are obtained by dividing the ceramic substrate 20S, are prepared. It is to be noted that the configuration of FIG. 19 is illustrated in an inverted manner with respect to the configuration illustrated in, for example, FIG. 9.

Figure 20A:
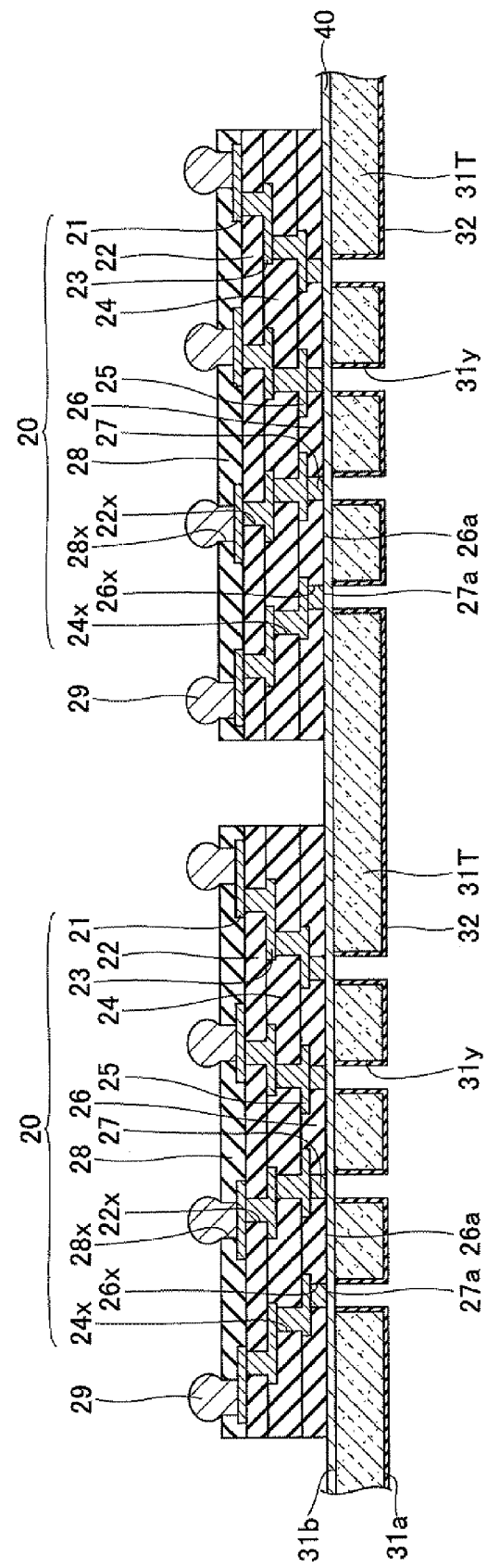
FIGS. 20A and 20B are schematic diagram for describing steps of manufacturing the wiring substrate according to the second embodiment of the present invention (part 2)
Figure 20B:
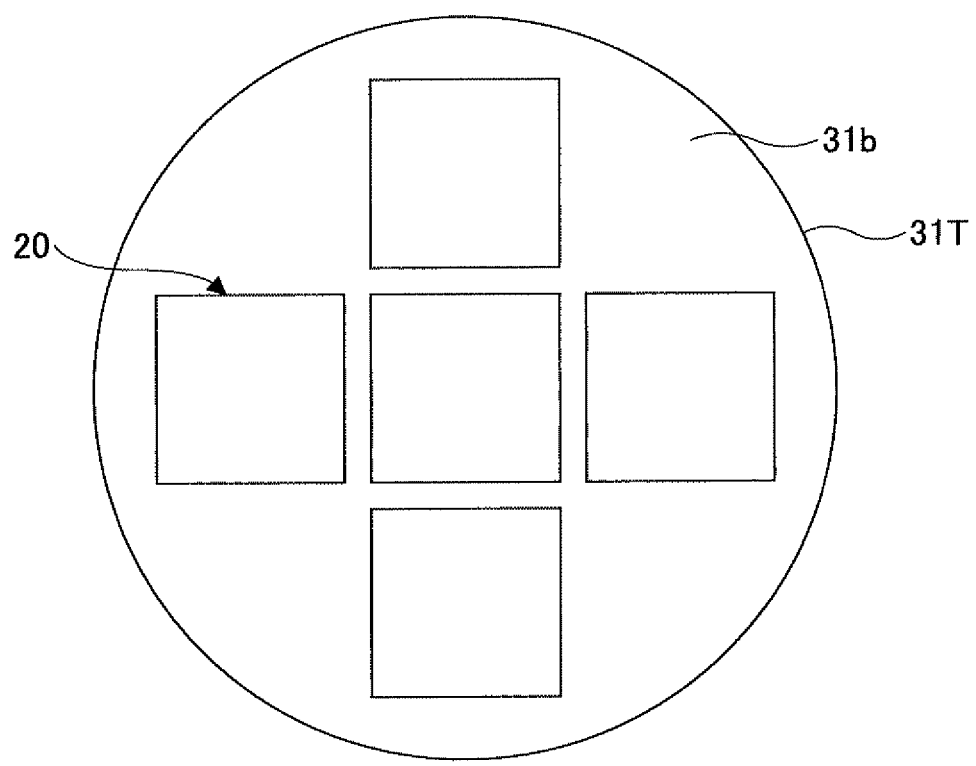

Then, in the step illustrated in FIGS. 20A and 20B, the plural ceramic substrates 20 are adhered to the substrate body 31T via the polymer layer 40. FIG. 20A is a cross-sectional view illustrating the plural ceramic substrates 20 adhered to the substrate body 31T via the polymer layer according to the second embodiment of the present invention. FIG. 20B is a plan view illustrating the plural ceramic substrates 20 adhered to the substrate body 31T via the polymer layer according to the second embodiment of the present invention. More specifically, first, the polymer layer 40 may be formed by, applying (e.g., spin-coating) a liquid type or a paste-like insulating resin on the first surface 26a of each of the ceramic substrates 20 or the second surface 31b of the substrate body 31T. The liquid type or paste-like insulating resist may contain, for example, benzocyclobutene (BCB), polybenzooxazole (PBO), or polyimide (PI). Alternatively, the polymer layer 40 may be formed by, laminating a film-like insulating resin onto the first surface 26a of each of the ceramic substrates 20 or the second surface 31b of the substrate body 31T. Likewise, the liquid type or paste-like insulating resist may contain, for example, benzocyclobutene (BCB), polybenzooxazole (PBO), or polyimide (PI). Each of the ceramic substrates 20 is adhered to the substrate body 31T via the polymer layer 40 in a manner that the position of the electrodes 27 of each of the ceramic substrates 20 match the corresponding positions of the via holes 31y of the substrate body 31T. Because the polymer layer 40 in an uncured state is viscous, each of the ceramic substrates and the substrate body 31T can be temporarily adhered to each other via the polymer layer 40.

Alternatively, a film-like polymer insulating resin (benzocyclobutene (BOB), polybenzooxazole (PBO), or polyimide (PI)) having opening parts corresponding to the positions of the via holes 31y may be laminated as the polymer layer 40 to the first surface 26a of each of the ceramic substrates 20 or the second surface 31b of the substrate body 31T. In this case, the first surface 27a of the electrodes 27a are exposed in the opening parts of the polymer layer 40 and in the via holes 31y.

Figure 21:
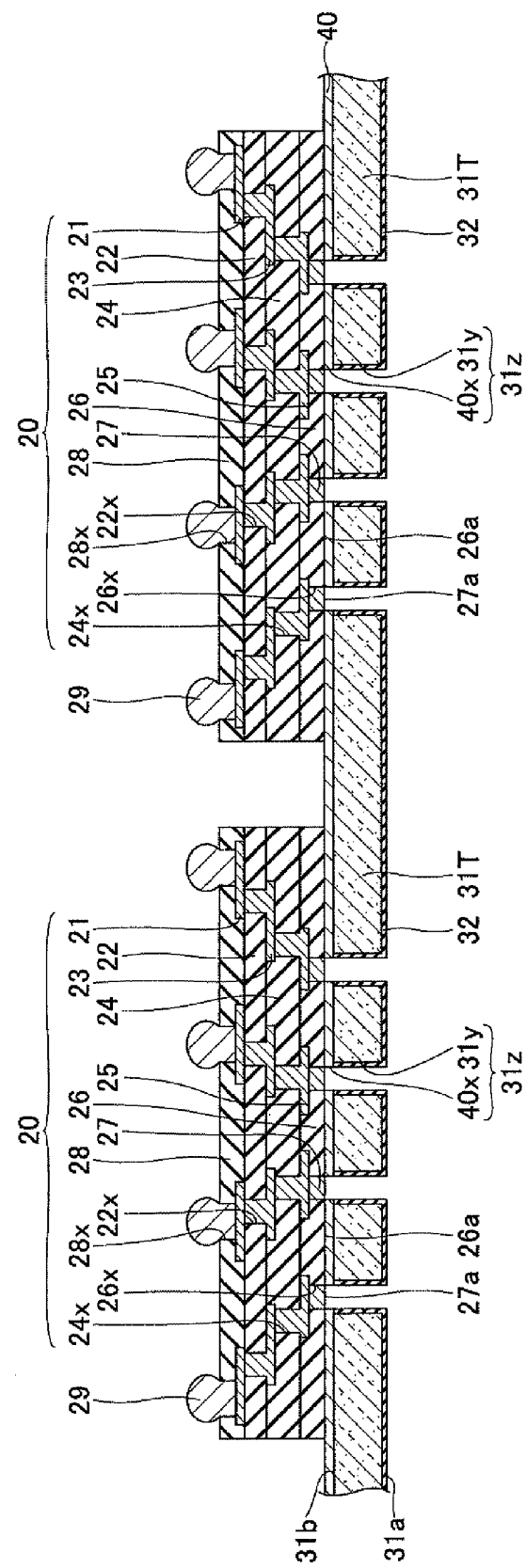
FIG. 21 is a schematic diagram for describing steps of manufacturing the wiring substrate according to the second embodiment of the present invention (part 3)

Then, in the step illustrated in FIG. 21, the areas (regions) of the polymer layer 40 exposed in the via holes 31y are removed and via holes 40x are formed in the removed areas (regions) so that the first surface 27a of the electrodes 27 becomes exposed. Then, the polymer layer 40 is cured at a temperature of approximately 250° C.-350° C. Thereby, each of the ceramic substrates 20 and the substrate body 31T is bonded via the polymer layer 40 (i.e. polymer bonding). The via holes 31y and the via holes 40x, which have the insulating layer 32 formed on an inner side surface thereof, form a together consecutive through-hole (hereinafter the through-hole is referred to as "via hole 31z").

In a case where a positive type photosensitive insulating resin is used as the material of the polymer layer 40, the via hole 40x can be formed by removing the polymer layer 40 exposed in the via hole 31y. The polymer layer 40 exposed in the via hole 31y is removed by irradiating, for example, UV light to the polymer layer 40 exposed in the via hole Sly where the substrate body 31T is used as a mask and developing the polymer layer 40 exposed in the via hole 31y. Alternatively, a non-photosensitive insulating resin may be used as the material of the polymer layer 40. The via hole 40x is formed by removing the polymer layer 40 exposed in the via hole 31y. In this case, the polymer layer 40 exposed in the via hole 31y is removed by irradiating, for example, a laser beam (e.g., $CO_2$ laser) to the polymer layer 40 exposed in the via hole 31y. In this case, however, residue may remain on the first surface 27a of the electrode 27 exposed in the via hole 40x of the polymer layer 40. Therefore, a cleaning process is to be performed on the first surface 27a of the electrode 27 inside the via hole 40x of the polymer layer 40.

It is to be noted that the step illustrated in FIG. 21 may be omitted in a case where a film-like polymer insulating resin (benzocyclobutene (BCB), polybenzooxazole (PBO), or polyimide (PI)) having opening parts corresponding to the positions of the via holes 31y is laminated as the polymer layer 40 to the first surface 26a of each of the ceramic substrates 20 or the second surface 31b of the substrate body 31T in the step illustrated in FIGS. 20A and 20B.

Further, the characteristics (e.g., electric characteristics) of each of the ceramic substrates 20 may be tested (evaluated) beforehand so that the yield of the wiring substrate 10 can be improved by bonding the substrate body 31T only to a ceramic substrate 20 evaluated as having satisfactory electric characteristics.

Then, in the step illustrated in FIG. 22, a supporting substrate 72 is adhered to each of the ceramic substrates 20 on a side opposite to the substrate body 31T. The supporting substrate 72 is preferably formed of a material having satisfactory heat resistance and satisfactory chemical resistance. Further, it is preferable to form the supporting substrate 72 with a flexible material capable of absorbing the height of the outer connection terminal 29. The material of the supporting substrate 72 may be, for example, a thermal peel tape or a PDMS (Poly-dimethyl-siloxane) tape. Further, the supporting substrate 72 may be a formed by adhereing PDMS tape to a reinforcing plate. The supporting substrate 72 may be formed having a thickness of, for example, 500 µm.

Figure 23A:
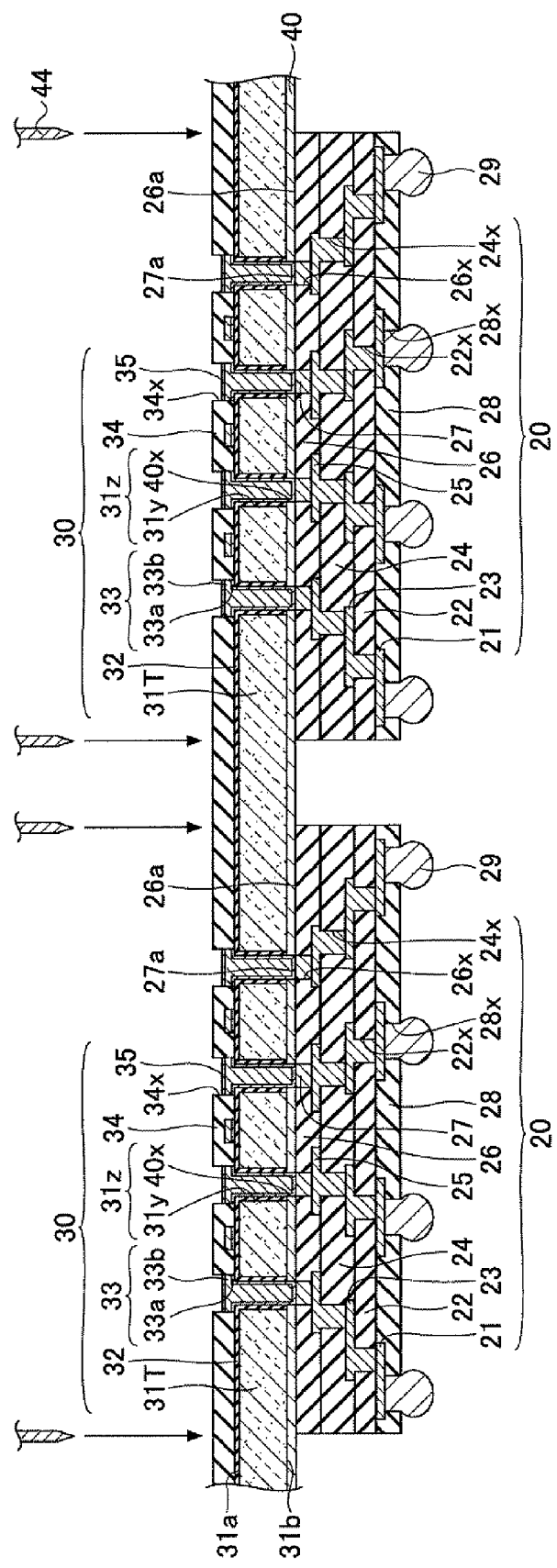
FIGS. 23A and 23B are schematic diagrams for describing steps of manufacturing the wiring substrate according to the second embodiment of the present invention (part 5)
Figure 23B:
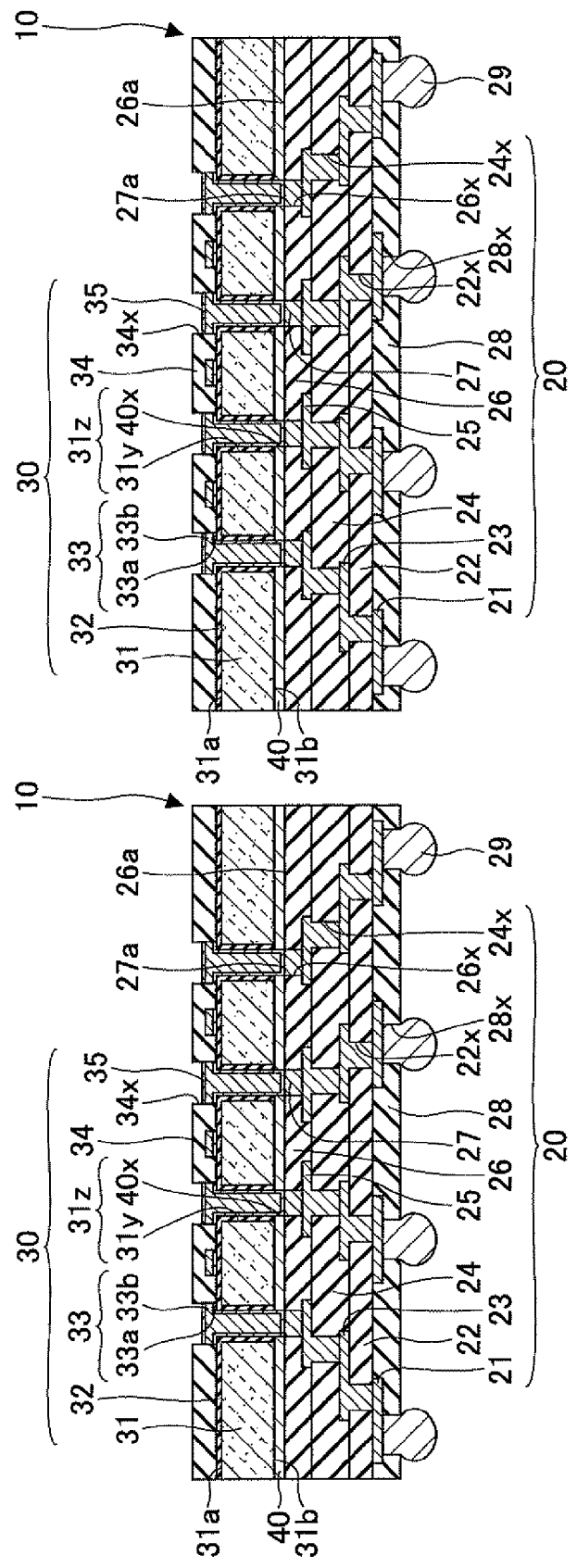

Then, in the step illustrated in FIGS. 23A and 23B, the configuration illustrated in FIG. 22 is turned upside-down (inverted) so that the supporting substrate 72 is faced downward. Then, the steps performed in FIGS. 12-17 of the first embodiment are performed on the inverted configuration of FIG. 22 (e.g., forming of the wiring layer). Then, by removing the supporting substrate 72, the configuration of FIG. 23A is obtained. Then, the configuration illustrated in FIG. 23A is divided into independent pieces by cutting a predetermined area (region) of the configuration illustrated in FIG. 23A. Thereby, as illustrated in FIG. 23B, manufacturing of the wiring substrate 10 including the ceramic substrate 20 and the silicon substrate (illustrated in FIG. 4) according to the second embodiment of the present invention is completed. The cutting of the configuration illustrated in FIG. 23A may be performed by, for example, dicing with a dicing blade 44. The predetermined area (region) of the configuration illustrated in FIG. 23A is not to be limited to a particular area as long as separate ceramic substrates 20 can be obtained. The predetermined area (region) of the configuration illustrated in FIG. 23A may be, for example, the outer edge parts of each of the ceramic substrates 20. By dicing the substrate body 31T, the substrate body 31 is obtained.

In the above-described second embodiment of the present invention, there is provided plural separate (independent) ceramic substrates in which each of the plural ceramic substrates includes plural ceramic layers and an inner wiring (wiring layer) and having electrodes electrically connected to the inner wiring and exposed from one side of the ceramic substrate. Further, there is provided a primary substrate having plural areas (regions) in which each of the areas (regions) corresponds to an independent substrate body obtained by dividing (separating) the areas of the substrate. The substrate body includes a front surface (first surface) and a back surface (second surface) on the side opposite of the front surface and having an insulating layer formed on the front surface of the silicon substrate body and via holes (with the insulating layer formed on an inner surface thereof) formed in positions corresponding to the electrodes of the ceramic substrate. Further, a polymer layer is formed on the first surface of each of the ceramic substrates or the back surface of the substrate. The first surface of each of the ceramic substrates and the back surface of the substrate are adhered to each other via the polymer layer in a manner that the position of the electrodes of each of the ceramic substrates matches the position of corresponding via holes of the substrate body.

Further, the electrodes of each of the ceramic substrates are exposed by removing the polymer layer exposed in the via holes and forming through-holes in the polymer layer. Further, via filling material, which is electrically connected to the electrodes of each of the ceramic substrates, is provided by filling the via holes of the insulating layer and the through-holes of the polymer layer with a conductive material. Further, a wiring pattern, which is electrically connected to the via filling material, is formed on the front surface of the substrate. Accordingly a silicon substrate having a wiring layer including the via filling material and the wiring pattern can be manufactured. Then, by dicing the above-described configuration having plural ceramic substrates bonded to the substrate via the polymer layer, plural wiring substrates can be obtained in which each of the wiring substrates has the ceramic substrate and the corresponding silicon substrate bonded by the polymer layer.

As a result, in addition to attaining the same effects (advantages) of the first embodiment, the second embodiment can also attain the following effects (advantages). That is, because a wiring substrate(s) is fabricated after performing polymer bonding between plural ceramic substrates and a substrate having plural areas (regions) in which each of the areas corresponds to an independent substrate body obtained by dividing (separating) the areas of the substrate, the characteristics (e.g., electric characteristics) of each of the plural ceramic substrates can be evaluated beforehand so that only a ceramic substrate evaluated to have a desired characteristic is used for performing the polymer bonding. Accordingly, the yield of the wiring substrate can be improved.

Third Embodiment

Next, an example of a semiconductor package 80 having a semiconductor chip 81 mounted on the wiring substrate 10 of FIG. 4 according to a third embodiment of the present invention is described. In the third embodiment, like components are denoted with like reference numerals as of those of the first embodiment and are not further explained.
(Configuration of Semiconductor Package)

Figure 24:
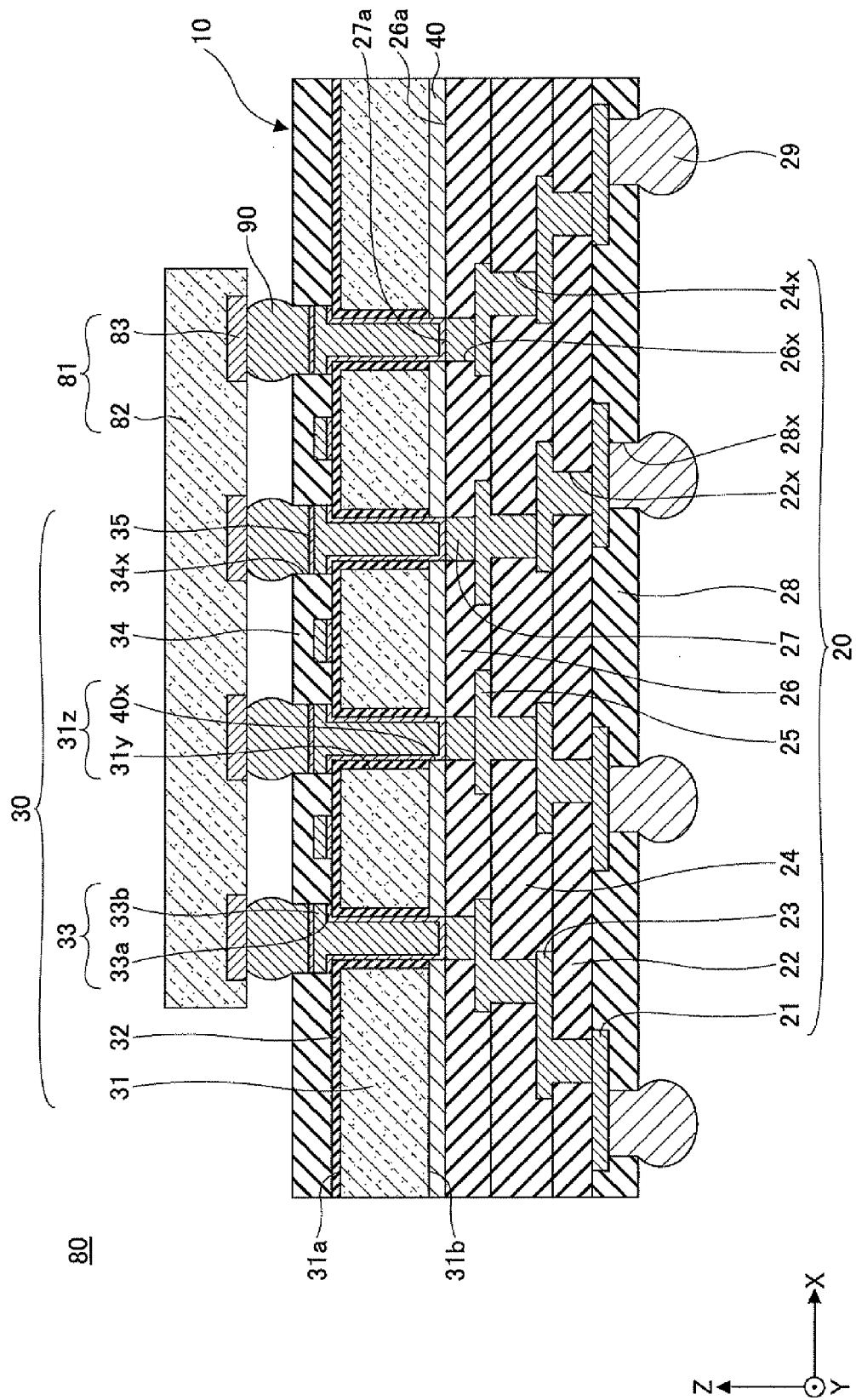
FIG. 24 is a cross-sectional view of an example of a semiconductor package according to a third embodiment of the present invention.

Next, an exemplary configuration of the semiconductor package 80 according to the third embodiment of the present invention is described. FIG. 24 is a cross-sectional view of an example of the semiconductor package 80 according to the third embodiment of the present invention. In FIG. 24, like components are denoted with like reference numerals as of those of the FIG. 4 and are not further explained. In the example illustrated in FIG. 24, the semiconductor package 80 includes the wiring substrate 10 of FIG. 4, the semiconductor chip 81, and plural solder bumps 90.

The semiconductor chip 81 includes a semiconductor substrate 82 and plural electrode pads 83. The semiconductor substrate 82 has a semiconductor integrated circuit (not illustrated) formed on a substrate formed of, for example, silicon (Si) or germanium (Ge). The plural electrode pads 83 are formed on one side of the semiconductor substrate 82 and are electrically connected to the semiconductor integrated circuit (not illustrated). The electrode pad 83 may be formed of, for example, aluminum (Al). The electrode pad 83 may be, for example, a Cu/Al layer (i.e. a metal layer including a Cu layer and an Al layer layered in this order), or a Cu/Al/Si layer (i.e. a metal layer including a Cu layer, an Al layer, and a Si layer layered in this order).

The plural solder bumps 90 electrically connect the third metal layer of the wiring substrate 10 and the electrode pads 83 of the semiconductor chip 81. The material of the solder bumps may be, for example, an alloy containing Pb, an alloy containing Sn and Cu, an alloy containing Sn and Ag, or an alloy containing Sn, Ag, and Cu.
(Method for Manufacturing Semiconductor Package)

Figure 25:
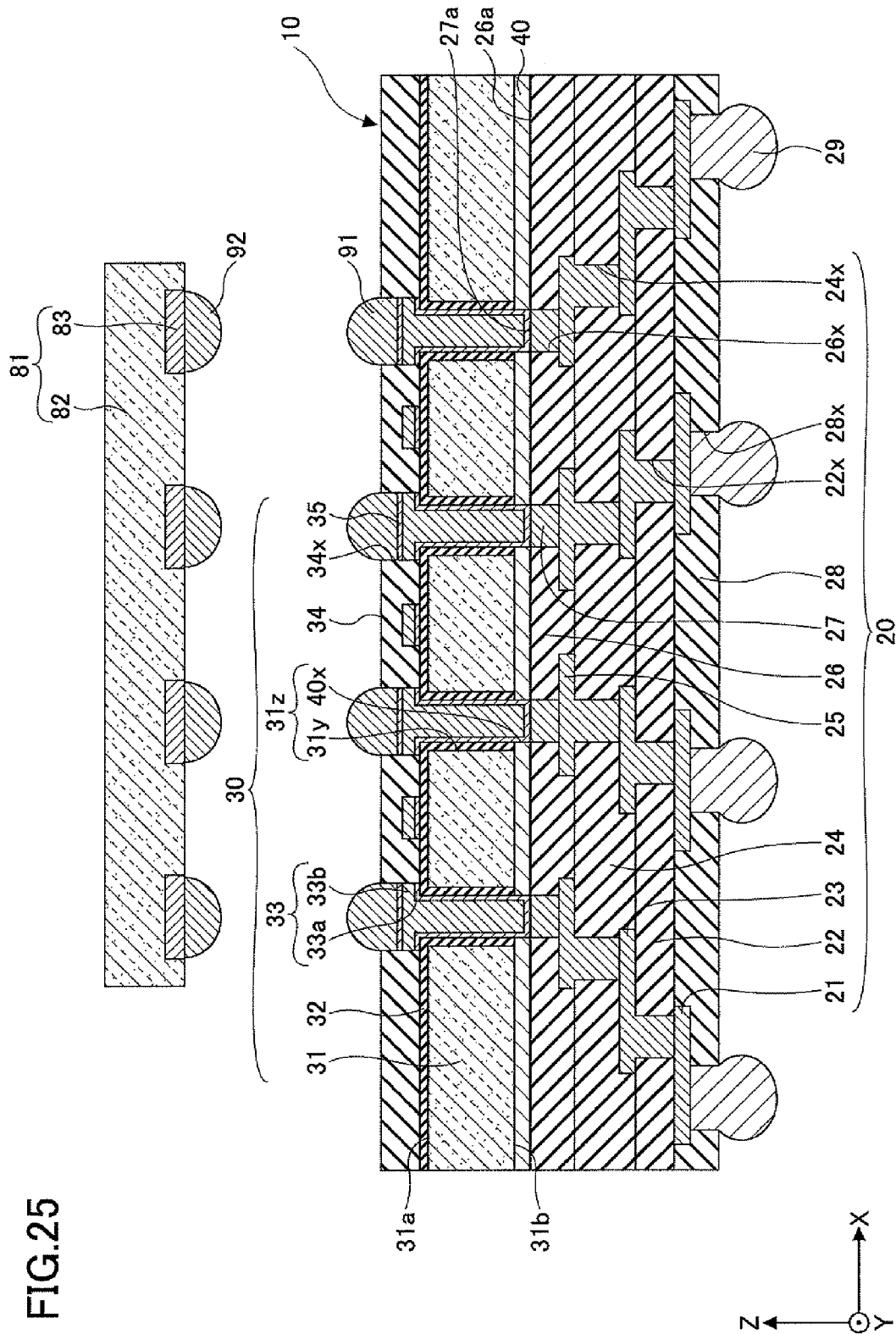
FIG. 25 is a schematic diagram for describing steps of manufacturing the semiconductor package according to the third embodiment of the present invention (part 1)
Figure 26:
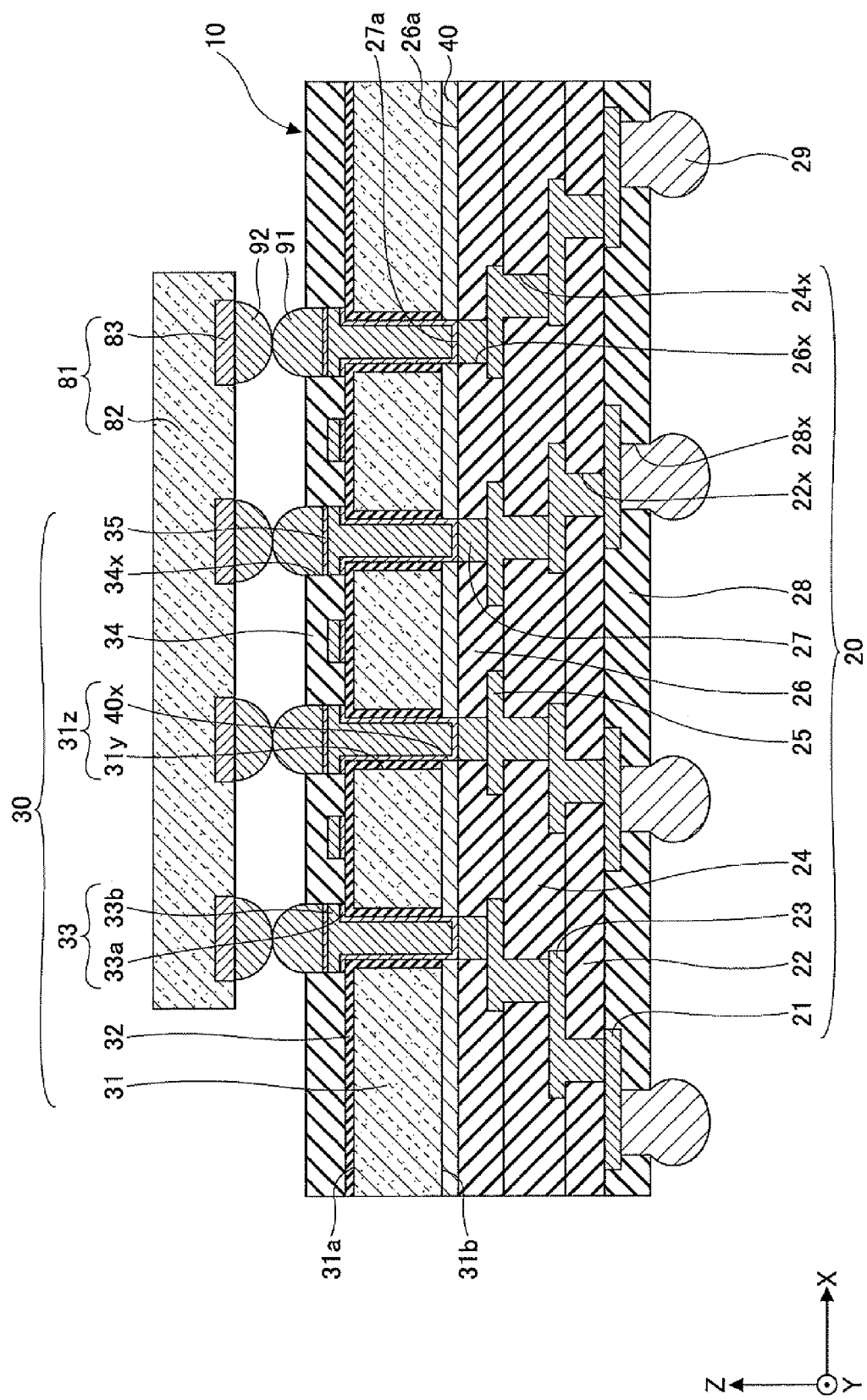
FIG. 26 is a schematic diagram for describing steps of manufacturing the semiconductor package according to the third embodiment of the present invention (part 2)

Next, an example of a method for manufacturing a semiconductor package according to the third embodiment of the present invention is described. FIGS. 25 and 26 illustrate the steps of the method for manufacturing the semiconductor package according to the third embodiment of the present invention. In FIGS. 25 and 26, like components are denoted with like reference numerals as of those of FIG. 24 and are not further explained.

First, in the step illustrated in FIG. 25, the wiring substrate 10 is prepared and plural pre-solder bumps 91 are formed on the third metal layer 35 of the wiring substrate 10. Further, the semiconductor chip 81 is prepared and plural pre-solder bumps 92 are formed on corresponding electrode pads 83 of the semiconductor chip 81. The pre-solder bumps 91, 92 are formed by applying solder paste onto the third metal layer 35 and the electrode pads 83 and performing a solder reflow process with the solder paste. The solder paste is formed of, for example, an alloy containing Pb, an alloy containing Sn and Cu, an alloy containing Sn and Ag, or an alloy containing Sn, Ag, and Cu.

Then, in the step illustrated in FIG. 26, the side of the third metal layer 35 of the wiring substrate 10 and the side of the electrode pads 83 of the semiconductor chip 81 are positioned facing each other, so that the positions of the pre-solder bumps 91 match the positions of the pre-solder bumps 92. Then, by heating the pre-solder bumps 91, 92 at a temperature of, for example, 230° C., the pre-solder bumps 91, 92 are melted to become a single alloy (i.e. solder bumps 90). Thereby, the manufacturing of the semiconductor package 80 (as illustrated in FIG. 24) is completed.

With the above-described third embodiment of the present invention, a semiconductor package having a semiconductor chip mounted on the wiring substrate of FIG. 11 via connection terminals can be manufactured. In a case where the semiconductor chip to be mounted on the wiring substrate is formed of silicon, the CTE of the silicon substrate of the wiring substrate and the CTE of the semiconductor chip are substantially equal. As a result, the thermal stress due to difference of CTE is unlikely to occur at the connecting portion between the wiring substrate and the semiconductor chip. Accordingly, the connection reliability between the wiring substrate and the semiconductor chip can be improved. As a result of the improved connection reliability between the wiring substrate and the semiconductor chip, the process of filling an underfill resin between the semiconductor chip and the silicon substrate can be omitted from the method for manufacturing the semiconductor package.

Further, by bonding the ceramic substrate and the silicon substrate of the wiring substrate via the polymer layer (i.e. polymer bonding), connection reliability between the ceramic substrate and the silicon substrate can be attained without having to match the CTE of the ceramic substrate with the CTE of the silicon substrate (approximately 3 ppm/° C.). Accordingly, the CTE of each ceramic layer (approximately 10 ppm/° C.-12 ppm/° C.) of the wiring substrate can be set with a value near the CTE of the target substrate (e.g., motherboard) formed mainly of a resin substrate (approximately 18 ppm/° C.). As a result, in a case of connecting the semiconductor package of the third embodiment to the target substrate (e.g., motherboard), thermal stress due to difference of CTE is unlikely to occur at the connection part between the wiring substrate and the target substrate (e.g., motherboard). Therefore, the connection reliability between the wiring substrate and the target substrate (e.g., motherboard) can be improved.

Further, among the ceramic layers of the ceramic substrate of the wiring substrate, the CTE of the ceramic layer situated far from the silicon substrate can be set to be higher than the CTE of the ceramic layer situated near the silicon substrate and set near the value of the CTE of the target substrate (e.g., motherboard). As a result, in a case of connecting the semiconductor package of the third embodiment to the target substrate (e.g., motherboard), thermal stress due to difference of CTE is unlikely to occur at the connection part between the wiring substrate and the target substrate (e.g., motherboard). Therefore, the connection reliability between the wiring substrate and the target substrate (e.g., motherboard) can be further improved.

First Modified Example of Third Embodiment

In the first modified example of the third embodiment, the semiconductor package 80 (see, for example, FIG. 24) of the third embodiment is modified. In the first modified example of the third embodiment, like components are denoted with like reference numerals as of those of third embodiment and are not further explained.

Figure 27:
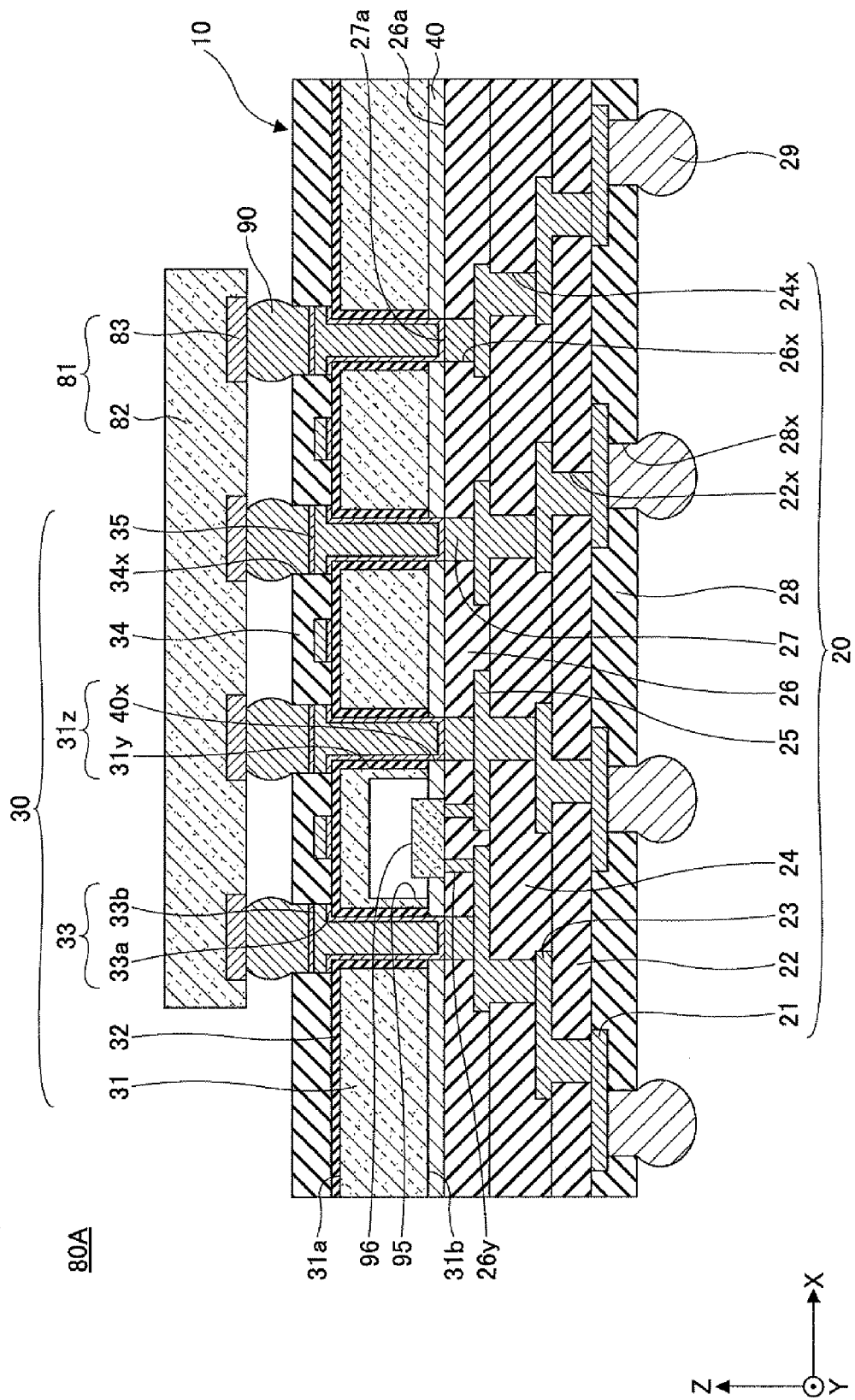
FIG. 27 is a cross-sectional view illustrating a semiconductor package according to a first modified example of the third embodiment of the present invention.

FIG. 27 is a cross-sectional view illustrating a semiconductor package 80A according to the first modified example of the third embodiment of the present invention. In FIG. 27, like components are denoted with like reference numerals as of those of FIG. 24 and are not further explained. In the semiconductor package 80A illustrated in FIG. 27, a hollow part 95 is provided in the substrate body part 31 of the wiring substrate 10, and an MEMS (Micro Electro Mechanical System) device 96 is provided inside the hollow part 95. Thereby, the MEMS device 96 is buried in the wiring substrate 10.

The hollow part 95 is formed in the substrate body 31 by performing anisotropic etching (e.g., DRIE (Deep Reactive Ion Etching) using $SF_6$) on the substrate body 31 before performing polymer bonding between the substrate body 31 and the ceramic substrate 20. The MEMS device 96 is electrically connected to the third wiring layer 25 via a via filling material filled in a fourth via hole 26y. The MEMS device 96 can be mounted to the ceramic substrate 20 before performing the polymer bonding between the substrate body 31 and the ceramic substrate 20. The polymer layer 40 is formed by laminating a film-like polymer insulating resin (e.g., benzocyclobutene (BCB)) having opening parts corresponding to the positions of the via holes 31y and the MEMS device 96 to the first surface 26a of the ceramic substrate 20. The MEMS device 96 may be, for example, a piezoelectric sensor or an acceleration sensor. The semiconductor chip 81 has a function of controlling the MEMS device 96.

In addition to attaining the same effects (advantages) of the third embodiment, the first modified example of third embodiment can also attain the following effects (advantages).

By forming a hollow part in a substrate body of a wiring substrate and providing an MEMS device inside the hollow part, a structure of a wiring substrate having an HEMS device buried therein can be obtained. By providing a function of controlling the MEMS device to the semiconductor chip, a semiconductor package, being provided with the MEMS device and being capable of controlling the MEMS device, can be obtained.

Second Modified Example of Third Embodiment

In the second modified example of the third embodiment, the semiconductor package 80 (see, for example, FIG. 24) of the third embodiment is modified. In the second modified example of the third embodiment, like components are denoted with like reference numerals as of those of third embodiment and are not further explained.

Figure 28:
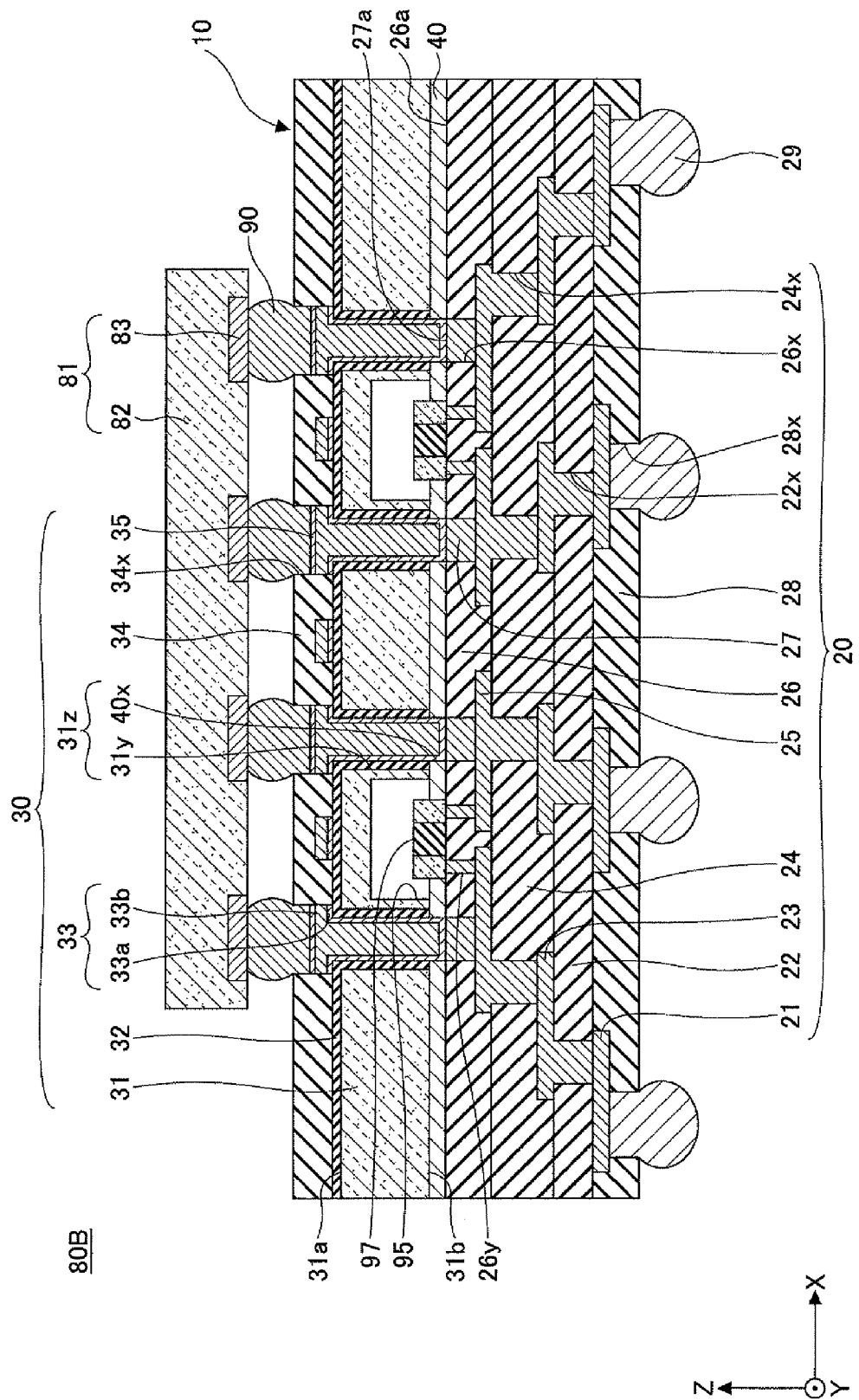
FIG. 28 is a cross-sectional view illustrating a semiconductor package according to a second modified example of the third embodiment of the present invention.

FIG. 28 is a cross-sectional view illustrating a semiconductor package 803 according to a modified example of the third embodiment of the present invention. In FIG. 28, like components are denoted with like reference numerals as of those of FIG. 24 and are not further explained.

In the semiconductor package 803 illustrated in FIG. 28, a hollow part 95 is provided in the substrate body part 31 of the wiring substrate 10, and a capacitor (chip capacitor) 97 is provided inside the hollow part 95. Thereby, the capacitor 97 is buried in the wiring substrate 10.

The hollow part 95 is formed in the substrate body 31 by performing anisotropic etching (e.g., DRIE (Deep Reactive Ion Etching) using $SF_6$) on the substrate body 31 before performing polymer bonding between the substrate body 31 and the ceramic substrate 20. The capacitor 97 is electrically connected to the third wiring layer 25 via a via filling material filled in a fourth via hole 26y. It is preferable for the capacitor 97 to be positioned immediately below the semiconductor chip 81. The capacitor 97 can be mounted to the ceramic substrate 20 before performing the polymer bonding between the substrate body 31 and the ceramic substrate 20. The polymer layer 40 is formed by laminating a film-like polymer insulating resin (e.g., benzocyclobutene (BCB)) having opening parts corresponding to the positions of the via holes 31y and the capacitor 97 to the first surface 26a of the ceramic substrate 20.

In addition to attaining the same effects (advantages) of the third embodiment, the second modified example of third embodiment can also attain the following effects (advantages).

By forming a hollow part in a substrate body of a wiring substrate and providing a capacitor inside the hollow part, a structure of a wiring substrate having a capacitor buried therein can be obtained. With this structure, the capacitor can be provided immediately below a semiconductor chip. Thereby, electric characteristics of the semiconductor package can be improved. It is to be noted that various electronic components other than the capacitor (e.g., resistor, inductor) may be provided inside the hollow part.

Third Modified Example of Third Embodiment

In the third modified example of the third embodiment, the semiconductor package 80 (see, for example, FIG. 24) of the third embodiment is modified. In the third modified example of the third embodiment, like components are denoted with like reference numerals as of those of third embodiment and are not further explained.

Figure 29:
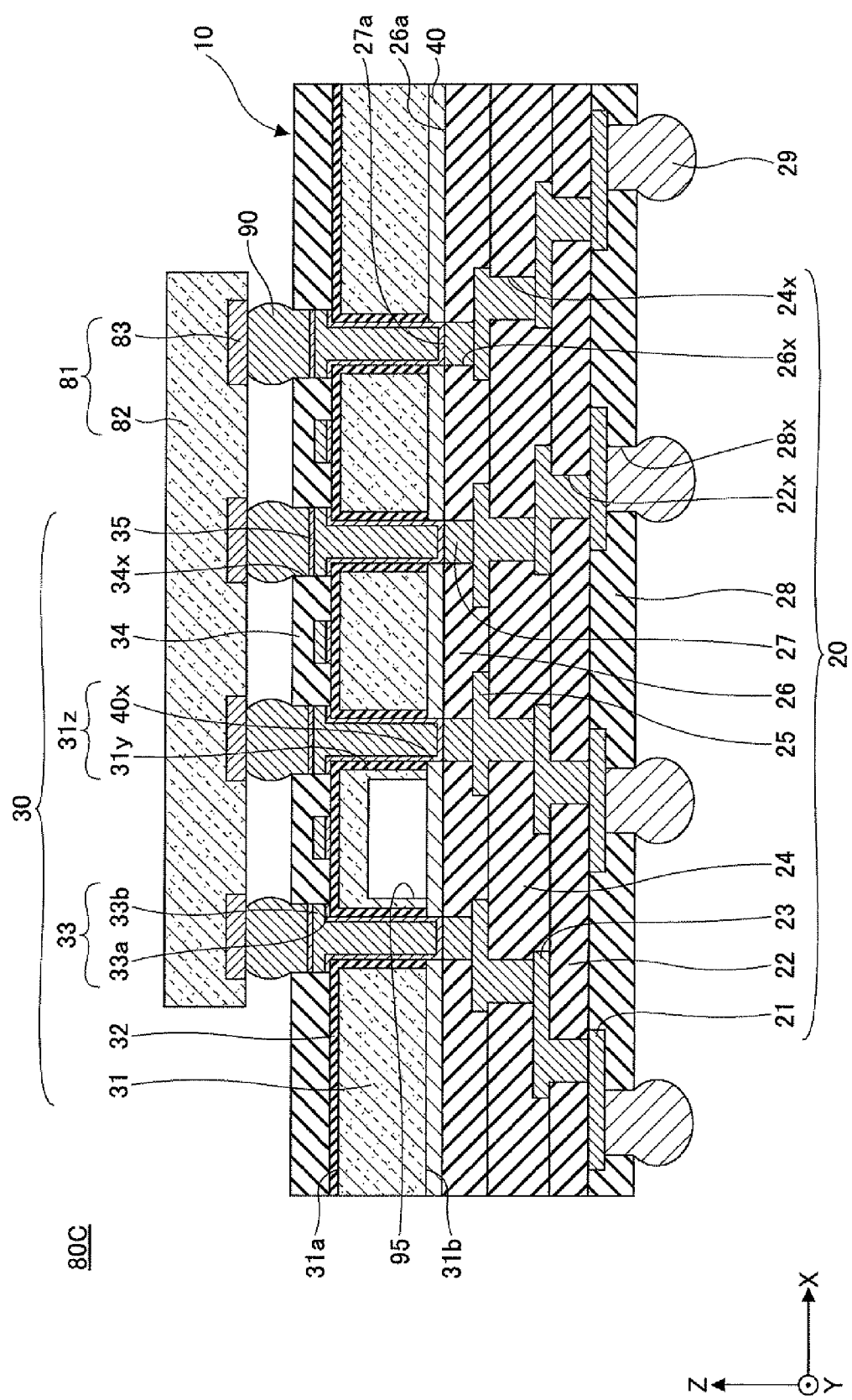
FIG. 29 is a cross-sectional view illustrating a semiconductor package according to a third modified example of the third embodiment of the present invention.

FIG. 29 is a cross-sectional view illustrating a semiconductor package 800 according to a modified example of the third embodiment of the present invention. In FIG. 29, like components are denoted with like reference numerals as of those of FIG. 24 and are not further explained.

In the semiconductor package 80C illustrated in FIG. 29, a hollow part 95 is provided in the substrate body part 31 of the wiring substrate 10. The hollow part 95 is used as a coolant flow path to which a coolant (e.g, water) is supplied.

The hollow part 95 is formed in the substrate body 31 by performing anisotropic etching (e.g., DRIE (Deep Reactive Ion Etching) using $SF_6$) on the substrate body 31 before performing polymer bonding between the substrate body 31 and the ceramic substrate 20. It is preferable for the hollow part 95 to be positioned immediately below the semiconductor chip 81.

In addition to attaining the same effects (advantages) of the third embodiment, the third modified example of third embodiment can also attain the following effects (advantages).

By forming a hollow part in a substrate body of a wiring substrate and using the hollow part as a coolant flow path to which a coolant (e.g, water) is supplied, a structure of a wiring substrate having a hollow part used as a coolant flow path can be obtained. With this structure, the hollow part can be provided immediately below a semiconductor chip. Thereby, heat releasing characteristics of the semiconductor package can be improved.

Further, the present invention is not limited to these embodiments, but variations and modifications may be made without departing from the scope of the present invention.

For example, according to an embodiment of the method for manufacturing a wiring substrate, instead of performing the steps of i) forming concave parts in the front surface of the substrate body, ii) forming the insulating layer on the front surface of the substrate body, the inner side surface of the concave parts, and the bottom surface of the concave parts, iii) penetrating the concave parts by polishing (reducing thickness of the substrate body) the back surface of the substrate body, and iv) forming via holes having its inner side surface covered by the insulating layer in this order, the steps of i) polishing (reducing thickness of the substrate body) the back surface of the substrate body, ii) forming via holes penetrating the polished substrate body, and iii) forming the insulating layer on a surface of the substrate body (including the front surface of the substrate body and the inner side surface of the via hole) may be performed in this order.

What is claimed is:

1. A wiring substrate comprising:
    a ceramic substrate including a plurality of ceramic layers, an inner wiring, and an electrode electrically connected to the inner wiring, the electrode exposed on a first surface of the ceramic substrate;
    a silicon substrate having a first surface and a second surface situated on an opposite side of the first surface and including a wiring pattern formed on the first surface and a via filling material having one end electrically connected to the wiring pattern and another end exposed at the second surface; and
    an insulating layer formed on the silicon substrate;
    wherein the silicon substrate includes a first via hole penetrating the silicon substrate from the first surface to the second surface,
    wherein the first via hole includes a via hole part having an inner side surface on which the insulating layer is formed,
    wherein the second surface of the silicon substrate is bonded to the first surface of the ceramic substrate via a polymer layer,
    wherein the polymer layer includes a second via hole continuing to the first via hole,
    wherein the first via hole has a diameter substantially equal to a diameter of the second via hole by having the insulating layer formed on the inner side surface of the via hole part,
    wherein the via filling material penetrates through the polymer layer and is directly and integrally bonded to the electrode of the ceramic layer,
    wherein the via filling material fills an inside of the first via hole and an inside of the second via hole.

2. The wiring substrate as claimed in claim 1, wherein each of the plural ceramic layers contains alumina cordierite.

3. The wiring substrate as claimed in claim 2, wherein each of the plural ceramic layers contains different amounts of alumina cordierite.

4. The wiring substrate as claimed in claim 3, wherein one of the plural ceramic layers situated far from the silicon substrate has a higher coefficient of thermal expansion (CTE) than the CTE of another one of the plural ceramic layers situated near the silicon substrate.

5. The wiring substrate as claimed in claim 1,
    wherein the insulating layer is formed on the first surface of the silicon substrate,
    wherein the via filling material contacts the insulating layer and the polymer layer in a thickness direction of the silicon substrate and the polymer layer.

6. The wiring substrate as claimed in claim 1, wherein the via hole part is formed of a part that has a diameter that is larger than a diameter of a surface of the electrode exposed on the first surface of the ceramic substrate, wherein the diameter of the second via hole is substantially equal to the diameter of the surface of the electrode exposed on the first surface of the ceramic substrate.

* * * * *